(12) United States Patent
Yang et al.

(10) Patent No.: US 11,081,180 B2
(45) Date of Patent: Aug. 3, 2021

(54) MEMORY DEVICE WITH BIT LINES DISCONNECTED FROM NAND STRINGS FOR FAST PROGRAMMING

(71) Applicant: SanDisk Technologies LLC, Addison, TX (US)

(72) Inventors: Xiang Yang, Santa Clara, CA (US); Huai-Yuan Tseng, San Ramon, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/842,112

(22) Filed: Apr. 7, 2020

(65) Prior Publication Data

US 2020/0243138 A1   Jul. 30, 2020

Related U.S. Application Data

(62) Division of application No. 16/000,257, filed on Jun. 5, 2018, now Pat. No. 10,636,487.

(51) Int. Cl.
*G11C 16/04* (2006.01)
*G11C 11/56* (2006.01)
(Continued)

(52) U.S. Cl.
CPC ...... *G11C 16/0483* (2013.01); *G06F 11/1012* (2013.01); *G06F 11/1072* (2013.01);
(Continued)

(58) Field of Classification Search
CPC ......... H01L 27/11556; H01L 27/11582; G11C 16/0483; G11C 16/0408; G11C 16/08;
(Continued)

(56) References Cited

U.S. PATENT DOCUMENTS 7,400,534 B2   7/2008   Maejima
7,411,825 B2   8/2008   Kutsukake et al.
(Continued)

OTHER PUBLICATIONS

Ding, Li, et al., "The Impact of Bit-Line Coupling and Ground Bounce on CMOS SRAM Performance," Proceedings of the 16th International Conference on VLSI Design, Jan. 2003, 6 pages.
(Continued)

*Primary Examiner* — Allison Bernstein
(74) *Attorney, Agent, or Firm* — Vierra Magen Marcus LLP

(57) ABSTRACT

Techniques for fast programming and read operations for memory cells. A first set of bit lines is connected to a first set of NAND strings and is interleaved with a second set of bit lines connected to a second set of NAND strings. The first set of NAND strings can be programmed by driving a voltage on the first set of bit lines while floating a voltage on the second set of bit lines, to reduce an inter-bit line capacitance and provide a relatively high access speed and a relatively low storage density (e.g., bits per memory cell). The second set of NAND strings can be programmed by concurrently driving a voltage on the first and second sets of bit lines, to provide a relatively low access speed and a relatively high storage density.

11 Claims, 21 Drawing Sheets

(51) Int. Cl.
   *G06F 11/10* (2006.01)
   *G11C 16/10* (2006.01)
   *G11C 16/08* (2006.01)
   *G06F 11/18* (2006.01)
   *H01L 27/11556* (2017.01)
   *G11C 16/34* (2006.01)
   *G11C 16/24* (2006.01)

(52) U.S. Cl.
   CPC ........ *G06F 11/186* (2013.01); *G11C 11/5628* (2013.01); *G11C 11/5671* (2013.01); *G11C 16/0408* (2013.01); *G11C 16/08* (2013.01); *G11C 16/10* (2013.01); *G11C 16/24* (2013.01); *G11C 16/3427* (2013.01); *H01L 27/11556* (2013.01); *G11C 2211/5641* (2013.01)

(58) Field of Classification Search
   CPC ..... G11C 16/10; G11C 16/24; G11C 16/3427; G11C 11/5621; G11C 11/5671
   See application file for complete search history.

(56) References Cited

U.S. PATENT DOCUMENTS

| | | | |
|---|---|---|---|
| 7,450,414 | B2 | 11/2008 | Scheuerlein |
| 7,551,466 | B2 | 6/2009 | Aritome |
| 7,577,031 | B2 | 8/2009 | Sekar et al. |
| 7,885,100 | B2 | 2/2011 | Park |
| 7,894,287 | B2 | 2/2011 | Kim |
| 7,986,554 | B2 | 7/2011 | Li |
| 8,065,467 | B2 | 11/2011 | Micheloni et al. |
| 8,130,556 | B2 | 3/2012 | Lutze et al. |
| 8,368,137 | B2 | 2/2013 | Mokhlesi et al. |
| 8,520,441 | B2 | 8/2013 | Yuh |
| 8,867,272 | B2 | 10/2014 | Liu et al. |
| 8,918,577 | B1 | 12/2014 | Gorobets et al. |
| 9,147,440 | B2 | 9/2015 | Kim et al. |
| 9,176,862 | B2 | 11/2015 | Chen et al. |
| 9,229,644 | B2 | 1/2016 | Ng et al. |
| 9,318,210 | B1 | 4/2016 | Hart et al. |
| 9,570,174 | B2 | 2/2017 | Dor et al. |
| 9,595,345 | B2 | 3/2017 | Mui et al. |
| 9,613,704 | B2 | 4/2017 | Lee |
| 9,653,167 | B2 | 5/2017 | Takekida |
| 9,703,719 | B2 | 7/2017 | Balakrishnan et al. |
| 10,726,923 | B2 * | 7/2020 | Yang ............... G11C 16/10 |
| 2002/0186591 | A1 | 12/2002 | Lee et al. |
| 2007/0297233 | A1 | 12/2007 | Maejima |
| 2009/0168532 | A1 | 7/2009 | Sel et al. |
| 2013/0339603 | A1 | 12/2013 | Zhu et al. |
| 2016/0086671 | A1 | 3/2016 | Lee et al. |
| 2016/0267991 | A1 | 9/2016 | Hashimoto et al. |
| 2019/0371394 | A1 | 12/2019 | Yang et al. |

OTHER PUBLICATIONS

International Search Report & The Written Opinion of the International Searching Authority dated May 24, 2019, International Applicatio No. PCT/US2019/017393.
Restriction Requirement dated Mar. 29, 2019, U.S. Appl. No. 16/000,257, filed Jun. 5, 2018.
Response to Restriction Requirement dated May 16, 2019, U.S. Appl. No. 16/000,257, filed Jun. 5, 2018.
Non-final Office Action dated Jul. 15, 2019, U.S. Appl. No. 16/000,257, filed Jun. 5, 2018.
Response to Non-final Office Action dated Oct. 15, 2019, U.S. Appl. No. 16/000,257, filed Jun. 5, 2018.
Final Office Action dated Nov. 25, 2019, U.S. Appl. No. 16/000,257, filed Jun. 5, 2018.
Response to Final Office Action dated Feb. 25, 2020, U.S. Appl. No. 16/000,257, filed Jun. 5, 2018.
Notice of Allowance dated Mar. 4, 2020, U.S. Appl. No. 16/000,257, filed Jun. 5, 2018.

* cited by examiner

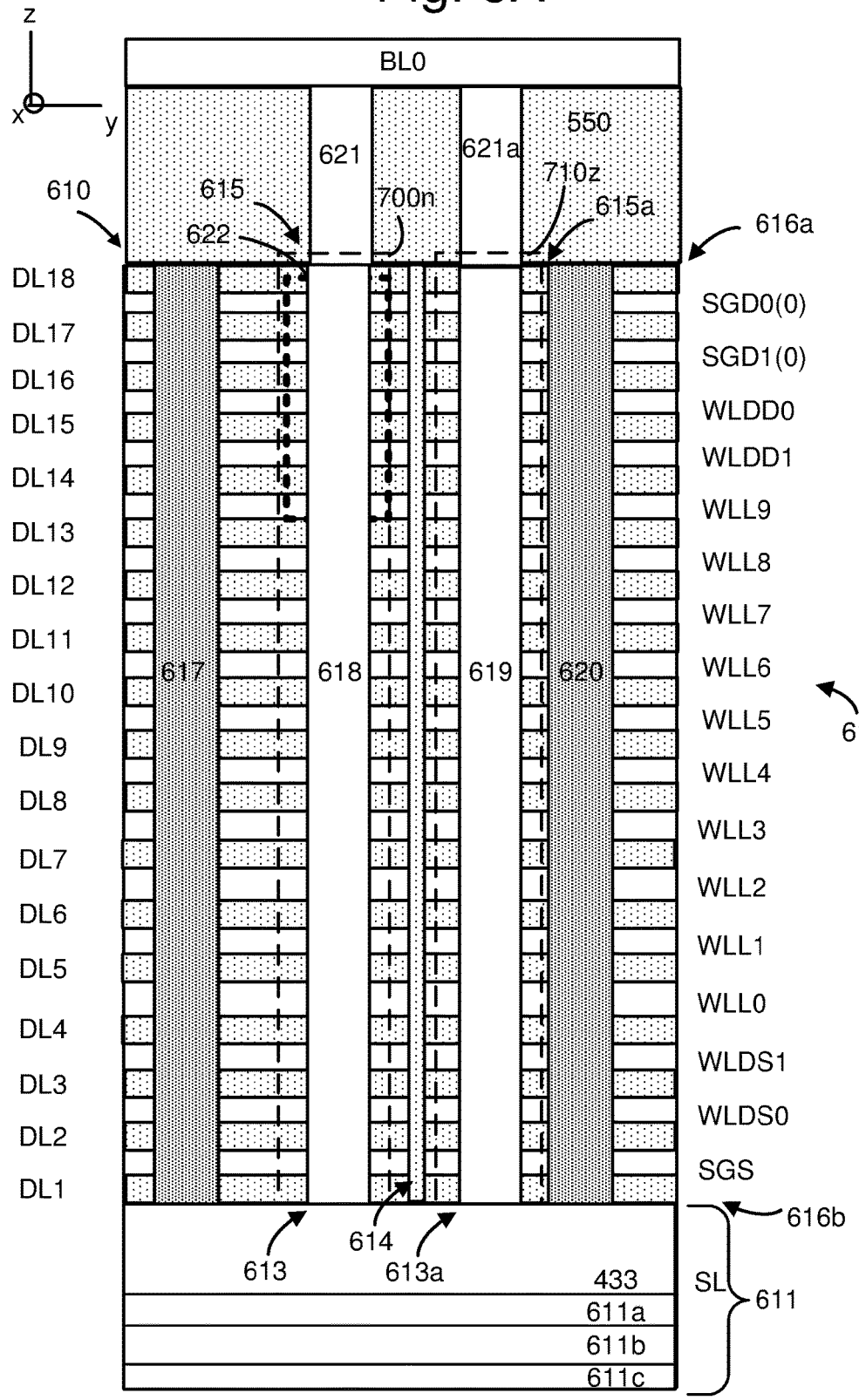
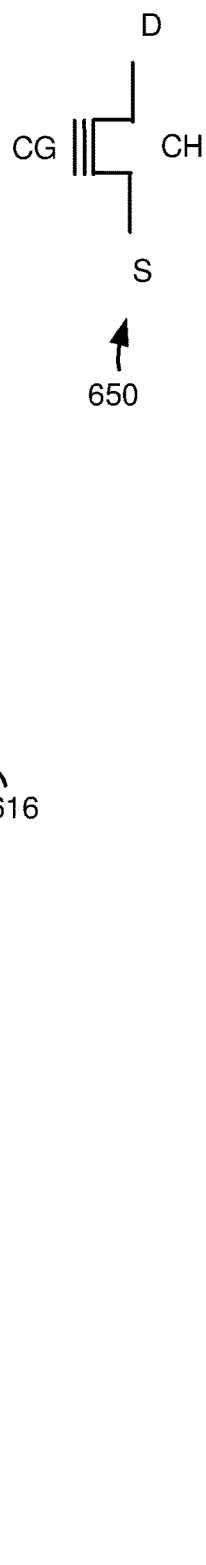
Fig. 5A
Fig. 5B

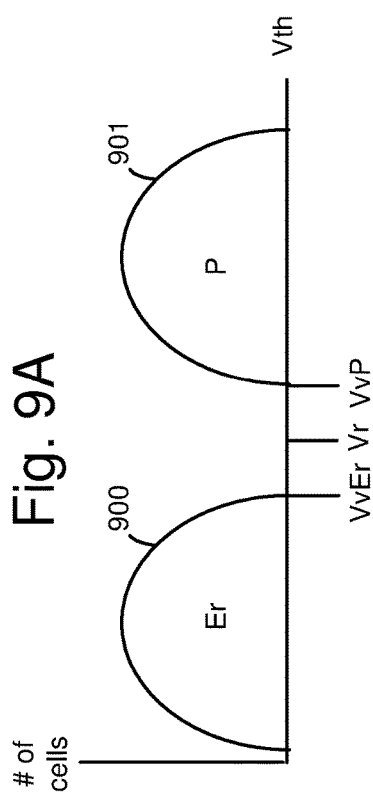
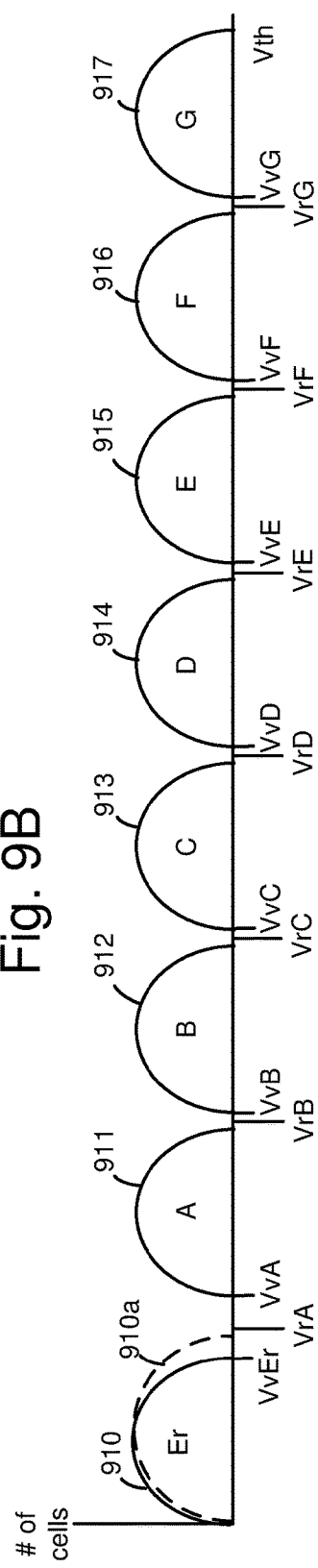
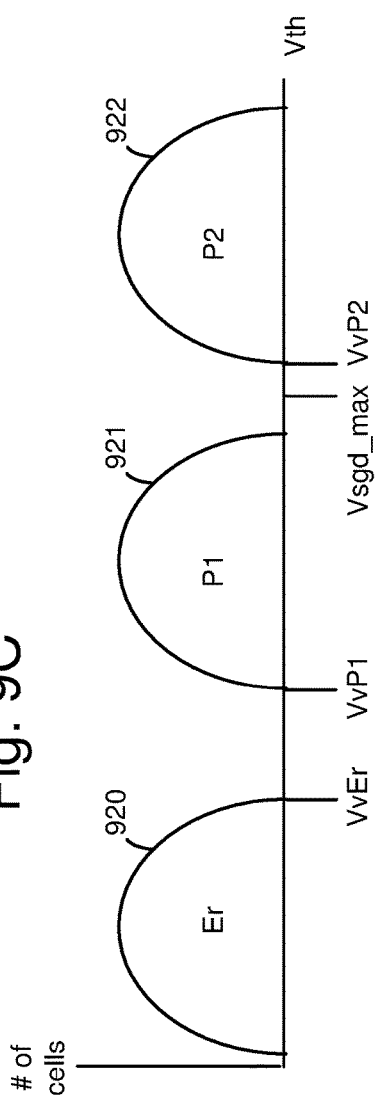

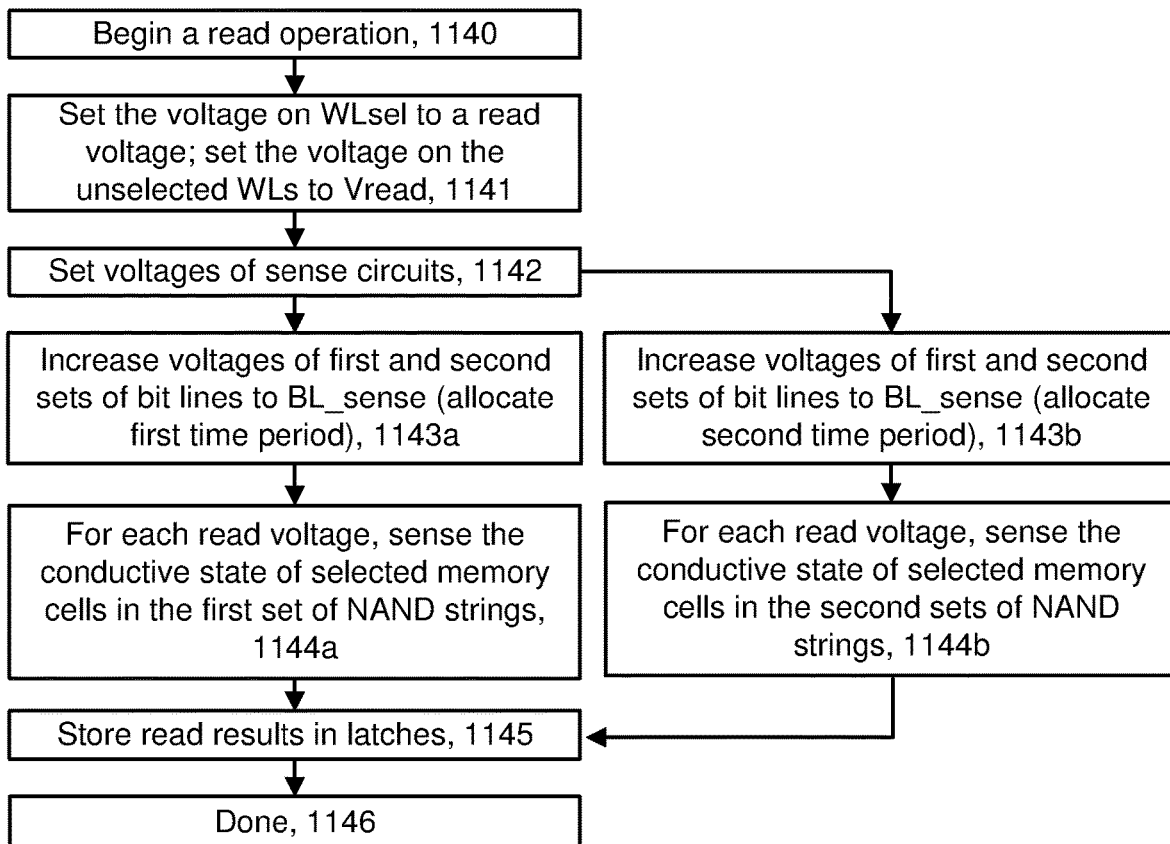
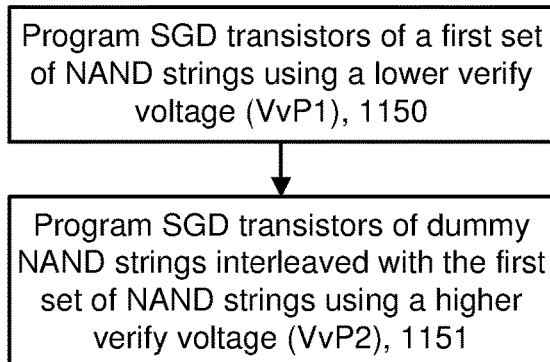

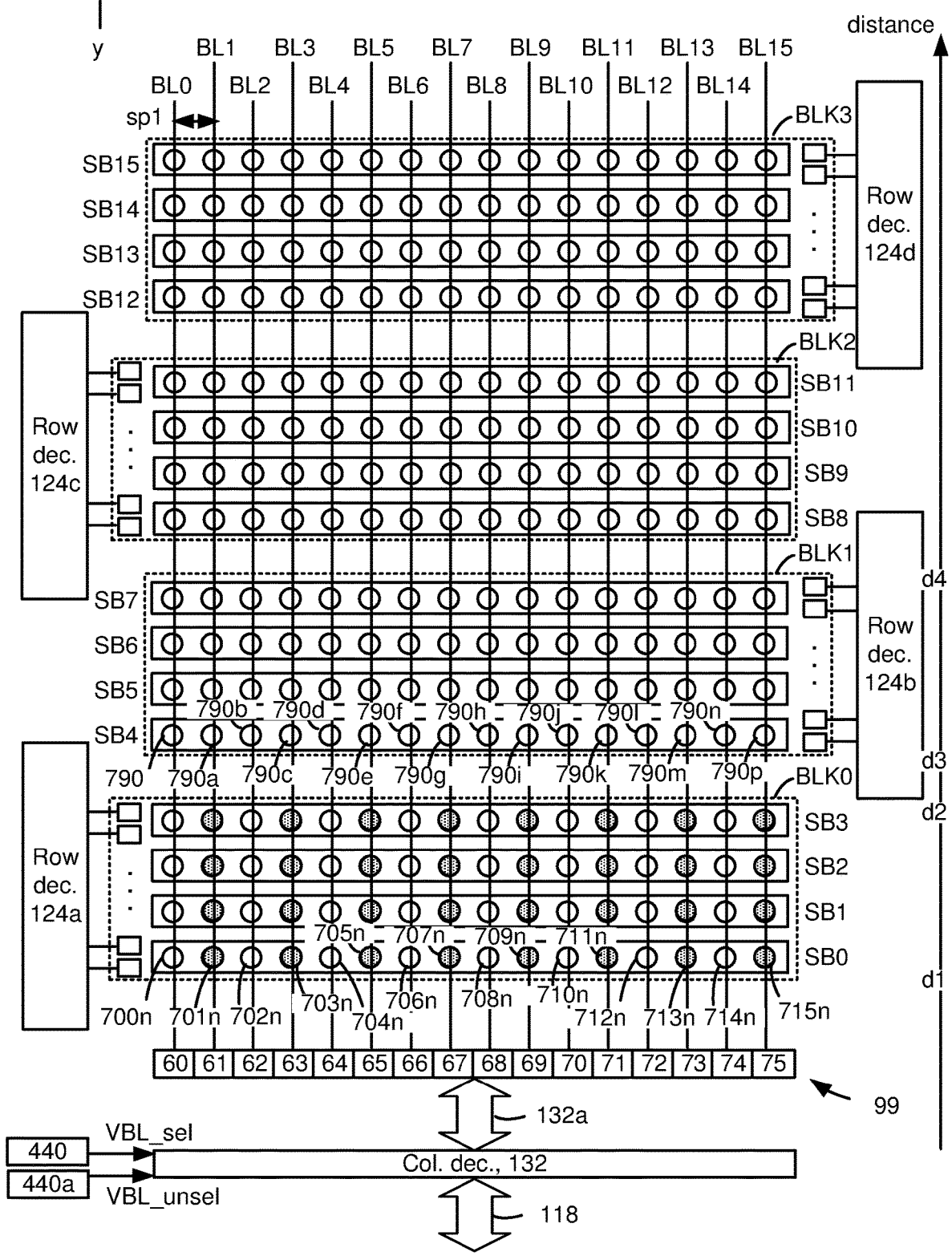

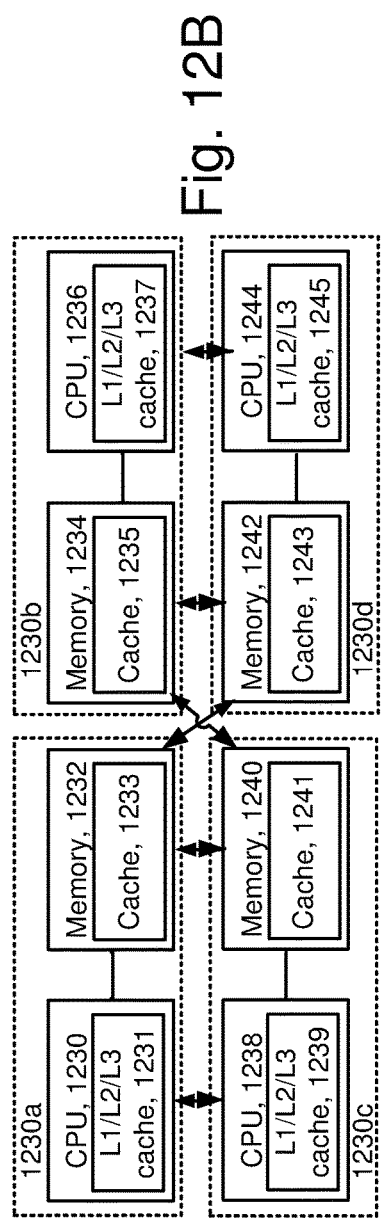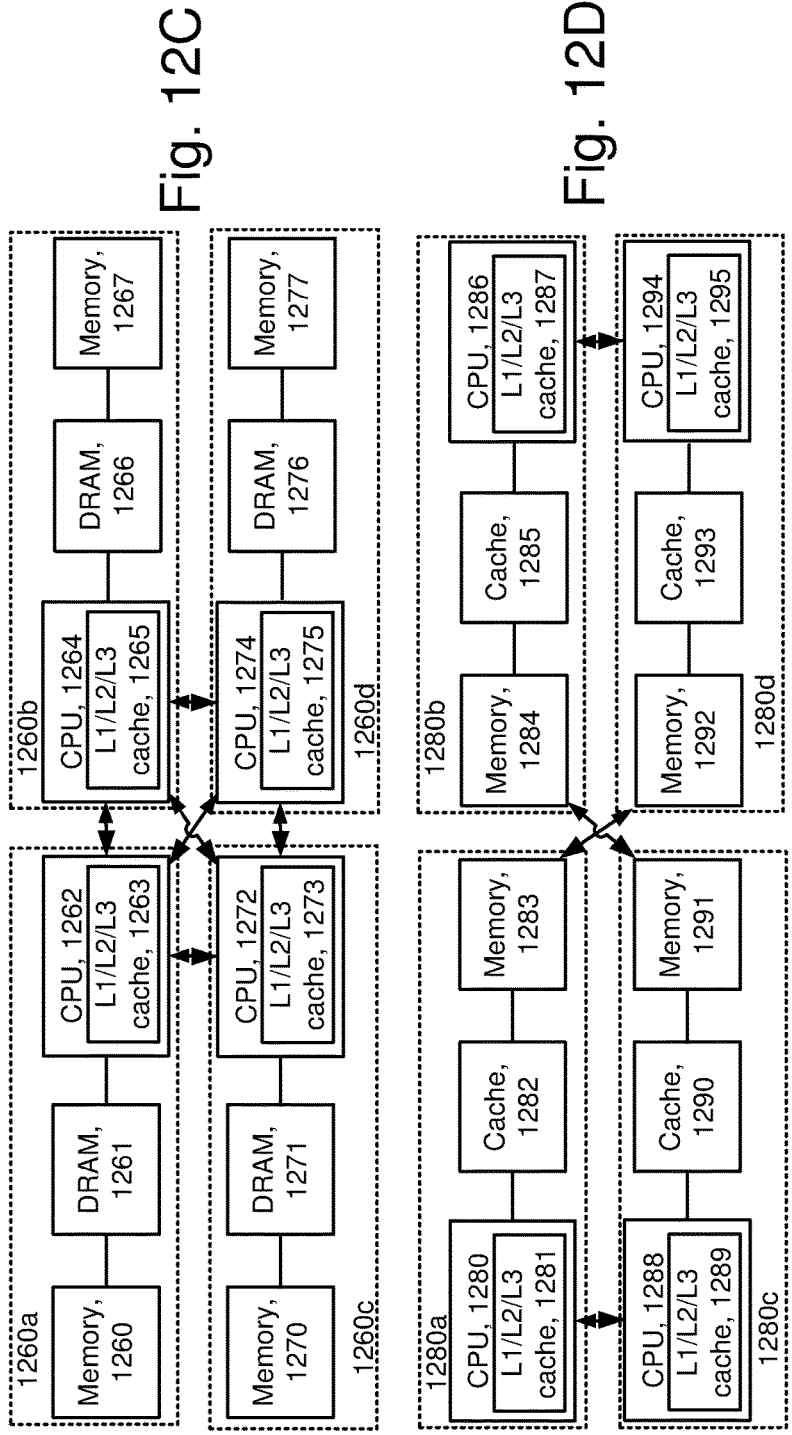

US 11,081,180 B2

MEMORY DEVICE WITH BIT LINES DISCONNECTED FROM NAND STRINGS FOR FAST PROGRAMMING

CLAIM OF PRIORITY

This application is a divisional application of U.S. patent application Ser. No. 16/000,257, entitled "MEMORY DEVICE WITH BIT LINES DISCONNECTED FROM NAND STRINGS FOR FAST PROGRAMMING," by Yang et al., filed Jun. 5, 2018, published as US 2019/0371394 on Dec. 5, 2019 and issued as U.S. Pat. No. 10,636,487 on Apr. 28, 2020, incorporated by reference herein in its entirety.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 5A depicts an example cross-sectional view of a portion of BLK0 of FIG. 4, where NAND strings 700$n$ and 710$n$ are connected to a bit line BL0 by vias 621 and 621$a$, respectively.

FIG. 5B depicts an example transistor 650.

FIG. 9A depicts threshold voltage (Vth) distributions 900 and 901 of SLC memory cells in an erased (Er) state and a programmed (P) state, respectively.

FIG. 9B depicts an example Vth distribution of a set of MLC memory cells in eight data states.

FIG. 9C depicts an example Vth distribution of select gate transistors.

FIG. 11E depicts an example read operation which can implement the process of FIG. 11A.

FIG. 11F depicts an example program operation for SGD transistors, consistent with FIG. 9C.

FIG. 12A depicts a top view of the set of blocks BLK0-BLK3 of FIG. 4, including NAND strings and their connections to bit lines, in an example configuration of a memory device for implementing the process of FIG. 11A with high and low access speed blocks.

FIG. 12B depicts an example architecture consistent with FIG. 12A.

FIG. 12C depicts an example computing-centric architecture.

FIG. 12D depicts an example memory-centric architecture.

DETAILED DESCRIPTION

Figure 1:
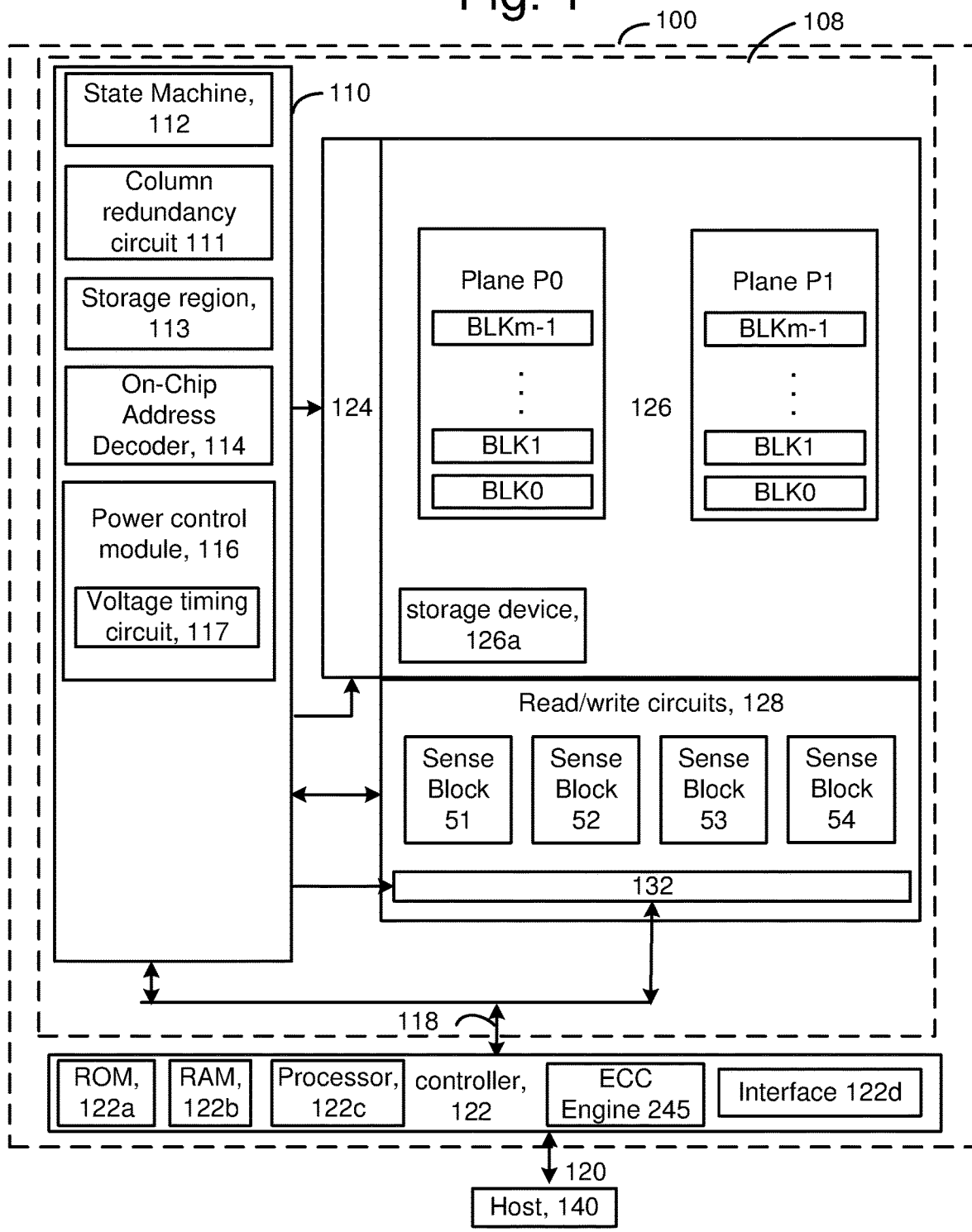
FIG. 1 is a block diagram of an example memory device.

Apparatuses and techniques are described for fast programming and read operations for memory cells.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 10B. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased state or be programmed to a programmed data state. For example, in a single bit per cell memory device, also referred to as SLC, or single level cell, there are two data states including the erased state and the programmed state. See FIG. 9A. MLC or multi-level cells store two or more bits per cell, as a multiple bit memory cell. For example, in a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 9B). In a four-bit per cell memory device, there are sixteen data states including the erased state (S0) and fifteen higher data states (S0-S15).

SLC programming is relatively fast and has high endurance, although the storage density (number of bits stored per memory cell) is lower than when multiple bits are stored in each memory cell. Regarding program speed, the SLC programming can be performed using only one program pulse in many cases. Read speed is also high because only one read voltage is needed and error correction can be simplified due to a wide margin between the two data states. Regarding endurance, data programmed by SLC programming can be read back accurately after many read cycles because there is a wider margin between the erased and programmed data states compared to MLC programming. SLC programming can therefore be used for applications in which program and read speed, and endurance, are of highest concern. For example, a set of SLC memory cells can be used as a cache between a CPU and a set of MLC memory cells. See also FIG. 12B-12D. An external controller can quickly program data to a block of SLC memory cells, and this data can be subsequently transferred to a block of MLC memory cells while the external controller performs another task. High endurance is important when the data is read many times in repeated read cycles, such as data stored in a server.

After the memory cells are programmed, the data can be read back in a read operation. A read operation can involve applying one read voltage, a series of read voltages, to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltages of adjacent data states. During the read operation, the voltages of the unselected word lines are ramped up to a read pass voltage which is high enough to place the unselected memory cells in a strongly conductive state, to avoid interfering with the sensing of the selected memory cells.

However, resistance-capacitance (RC) delays limit the ability to improve program and read speeds. For example, when applying a voltage signal to a bit line, a certain amount of time is allocated to change a voltage based on the RC time constant of the bit line. The RC time constant is a function of the bit line dimensions and material. Additionally, a capacitance between bit lines can further reduce performance.

Techniques provided herein address the above and other issues. In one aspect, different sets of NAND strings are connected to a set of bit lines. The sets of bit lines can include a first set of bit lines interleaved with a second set of bit lines. The first set of NAND strings have a relatively high access speed (e.g., read/write speed) and a relatively low storage density (e.g., bits per memory cell). In contrast, the second set of NAND strings have a relatively low access speed and a relatively high storage density. As an example, the time used for a sensing operation may be reduced by about one-half, e.g., from 20 to 10 μsec., and these may represent relatively low and high access speeds, respectively.

The first and second sets of NAND strings may be in different sub-blocks or blocks, for example. Further, the first set of NAND strings can be accessed by driving a voltage on the first set of bit lines while floating a voltage on the second set of bit lines. The floating reduces an inter-bit line capacitance so that a time allocated for changing a voltage on the first set of bit lines is reduced, resulting in the relatively high access speed. The second set of NAND strings are accessed by concurrently driving a voltage on the first and second sets of bit lines, where a time allocated for changing a voltage on the first and second sets of bit lines is greater than in the case of the relatively high access speed.

In particular, during a program operation for the first set of NAND strings, when a subset of bit lines in the first set of bit lines increase from 0 V to an inhibit voltage such as 2 V, floating the voltages of the second set of bit lines allows the bit line voltage of the subset of bit lines to reach and settle at 2 V more quickly than if the voltages of the second set of bit lines were driven, e.g., at 0 V.

During a sensing operation such as a read operation or a verify test, the first and second sets of bit lines can be driven at a common level to minimize inter-bit line capacitance. Additionally, the second set of bit lines do not draw current during the sensing of the first set of NAND strings so that displacement current is reduced. This also allows for a faster charge up of the voltages on the first set of bit lines during the sensing process.

Different sub-blocks or blocks can be provided which allow for different access speeds in the same memory device.

In one approach, the NAND strings in the first set of NAND strings are data-storing NAND strings which are separated from one another by dummy NAND strings which are ineligible to store data. See FIGS. 12A and 12E. The memory device can be fabricated with no conductive vias (see insulation regions 621c and 621d in FIG. 5D) between the dummy NAND strings and the bit lines. See FIG. 5D. In another approach, the first set of NAND strings are separated by insulated regions of the stack, and an inter-NAND string spacing (sp2, FIG. 12F) in the first set of NAND strings (e.g., BLK0) is greater than an inter-NAND string spacing (sp1, FIG. 12A) the second set of NAND strings (e.g., BLK1-3). See insulated region 1252 in FIG. 12F.

In another approach, there are conductive vias (see vias 621 and 621a in FIG. 5A) between the dummy NAND strings and the bit lines, but the SGD transistors of the dummy NAND strings are programmed to a higher Vth than SGD transistors of the data-storing NAND strings. See FIG. 9C. With a common control gate bias, the SGD transistors of the dummy NAND strings can be in a non-conductive state and electrically disconnected from the bit lines, while the data-storing NAND strings can be in a conductive state and electrically connected to the bit lines. This approach is advantageous because the SGD transistors can be erased and reconfigured as desired. Thus, a high access speed, low storage density block or sub-block can be changed to a low access speed, high storage density block or sub-block, and vice-versa, if desired.

In one approach, the memory cells with the relatively high access speed are SLC memory cells and the memory cells with the relatively low access speed are MLC memory cells. The SLC and MLC memory cells can be in different blocks or in different sub-blocks of a block.

These and other features are discussed further below.

FIG. 1 is a block diagram of an example memory device. The memory device 100, such as a non-volatile storage system, may include one or more memory die 108, also referred to as a chip or integrated circuit. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. In one embodiment, the memory structure comprise blocks of memory cells arranged in one or more planes. For example, blocks BLK0-BLKm−1 are arranged in each of planes P0 and P1. A plane may be an area of a substrate with a diffusion layer (such as the well region 433 in FIG. 3) which is common to each block in the plane, in one approach. The blocks in a plane typically share a common set of bit lines.

The read/write circuits 128 include multiple sense blocks 51-54 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via a path 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, a column redundancy circuit 111, an on-chip address decoder 114, and a power control module 116 (power control circuit). The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The column redundancy circuit provides a mapping between spare NAND strings which replace defective primary NAND strings. The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

The power control module can include a voltage timing circuit 116 which store data used in determining when to apply voltage signals. The data can indicate an amount of time to be allocated for a voltage signal to reach a steady state voltage during a voltage increase or decrease. As described further below, the amount of time which is allocated for a voltage change on a bit line can vary based on an RC time constant of the bit line. When a voltage signal is applied to two or more adjacent bit lines for relatively low access speed, high storage density memory cells, there is a chance that the voltage signals are at different levels. For example, one bit line may change from 0 V to 2 V to inhibit a NAND string from programming while an adjacent bit line remains at 0 V to allow a NAND string to program. A relatively long time period should be allocated for the bit line change from 0 V to 2 V. In contrast, when a voltage signal is applied to a selected bit line for a relatively high access speed, low storage density memory cell, the voltage signals on the adjacent bit lines may be floated, so that the RC time constant is reduced. A relatively short time period can then be allocated for the bit line change from 0 V to 2 V. The voltage timing circuit may set a time period for a bit line voltage change based on the block and/or sub-block location of the memory cells being accessed, and knowledge of whether the memory cells are configured for low or high access speed based on connections between the NAND strings (or channels of the memory cells of the NAND strings) and the bit lines.

The voltage timing circuit can control the time period between the start of a change in one voltage, such as a bit line voltage, and a start of a change in another voltage, such as a word line voltage. The voltage timing circuit can also control the time period between a start of a change in one voltage, such as a bit line voltage, and an event such as starting a discharge of a sense node in a sense circuit during sensing. See FIGS. 15 and 16 for example voltage signals.

The voltage timing circuit 117 may be configured with hardware, firmware and/or software for performing the techniques described herein including the processes of the flowcharts described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51-54, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

The controller 122 or control circuitry 110 can be configured with hardware, firmware and/or software for implementing the processes described herein, including the processes of the flowcharts of FIG. 11A-11K.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
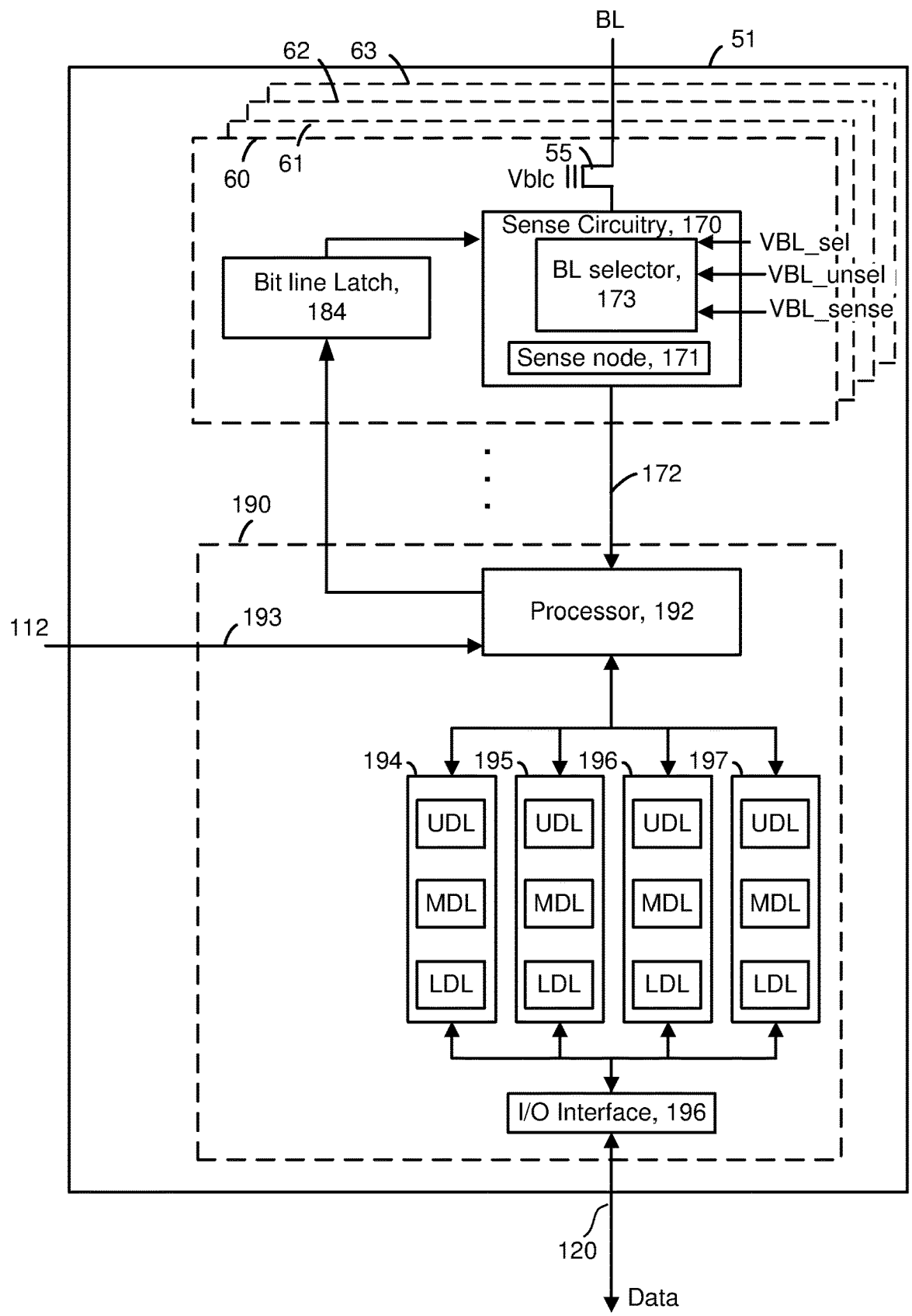
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

Figure 16:
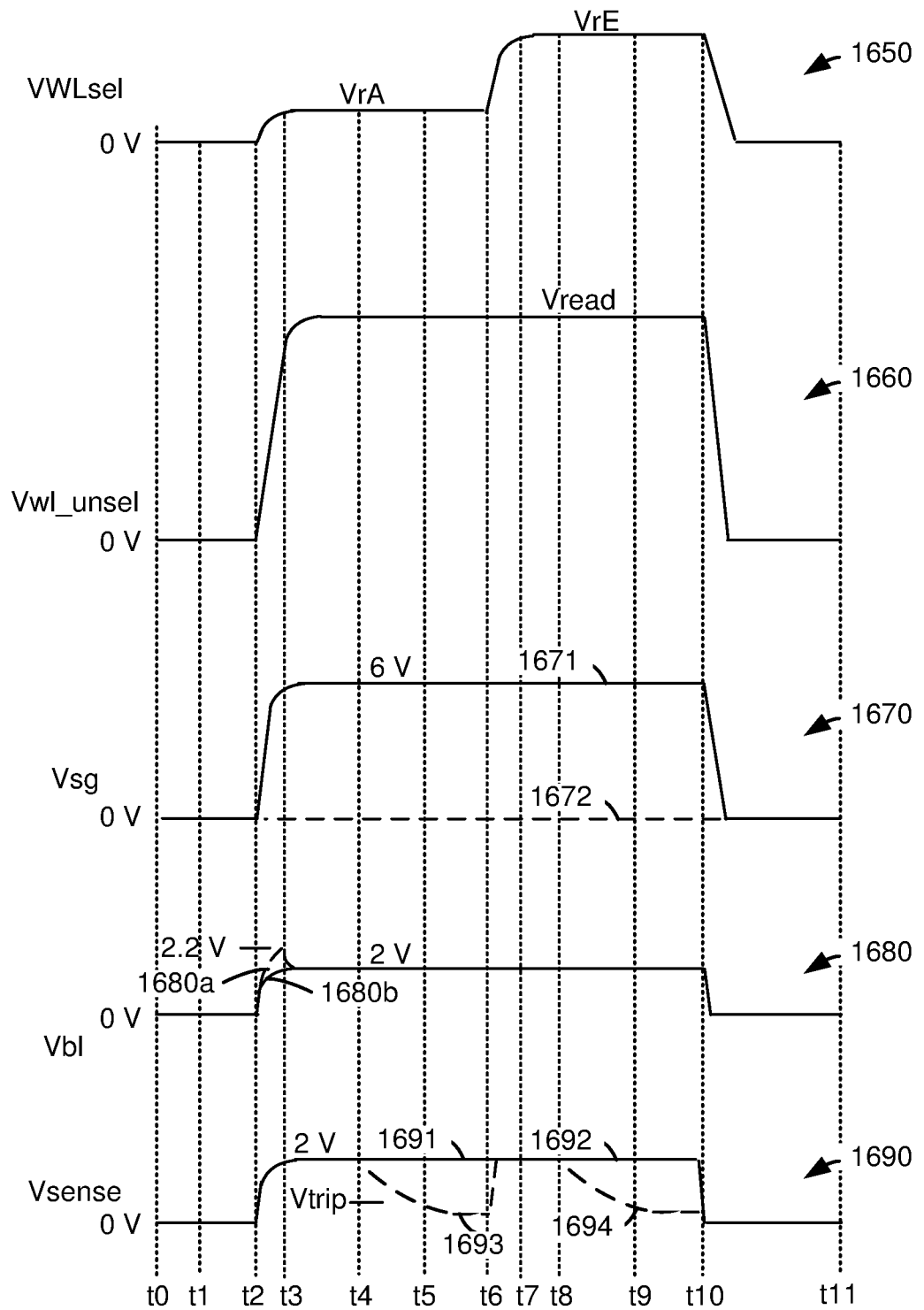
FIG. 16 depicts examples of voltage signals which can be used in a read operation, consistent with FIG. 11E.

The sense circuit 60, as an example, comprises sense circuitry 170 that performs sensing by determining whether a conduction current in a connected bit line is above or below a predetermined threshold level. The sense circuitry may include a sense node 171 which is charged up during sensing. An amount of decay of the sense node is used to determine whether a memory cell is in a conductive or non-conductive state. See also FIG. 16, plot 1690. Sense circuit 60 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming. During a program operation, the flag can be provided to a bit line (BL) selector 173 which is configured to pass VBL_sel, a voltage for a selected bit line or NAND string, or VBL_unsel, a voltage for an unselected bit line or NAND string, to the bit line. VBL_unsel, e.g., 2 V, inhibits programming while VBL_sel, e.g., 0 V, does not inhibit programming.

During a sensing operation, the BL selector may pass a sense voltage, VBL_sense, e.g., 2 V, to a transistor 55 to charge up the bit line. The transistor 55 may be provided between the bit line and the sense circuitry to clamp a voltage of the bit line during the sensing operation. Vbl is clamped at a level which is equal to the control gate voltage Vblc minus the Vth of the transistor. For example, Vbl may be clamped at 2−1=1 V. VBL_sense is applied to the drain of the transistor and Vbl is provided is at the source of the transistor, which acts as a source-follower. The time needed to charge up a bit line can vary based on the data state of the selected memory cell in the associated NAND string. If the data state is relatively high, e.g., the G state, the resistance of the selected memory cell is relatively high because the amount of overdrive is relatively low. That is, Vread-Vth of the cell is relatively high. As a result, the time needed to charge up a bit line will be relatively high. With selected memory cells of different NAND strings in different data states, the voltage signals will vary on different bit lines.

If a sensing operation involves adjacent NAND strings, such as in the case of a second set of NAND strings mentioned previously, the variation on adjacent bit lines causes an inter-bit line capacitance and displacement current which increases the time needed to charge up the bit lines. In contrast, if a sensing operation involve every other NAND string, such as in the case of a first set of NAND strings mentioned previously, the adjacent bit lines are electrically disconnected from the memory cells of the NAND strings, so there is no data state-dependent variation in the time to charge up these bit lines. Moreover, no current is drawn from the bit line to the memory cell channel. The time allocated for charging up the bit lines can therefore be reduced.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per storage element implementation.

The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuitry sets it to an inhibit value during the verify process.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify voltage. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. a MDL or UDL latch is flipped when a middle or upper page bit, respectively, is stored in an associated storage element. This occurs when an associated storage element completes programming, e.g., when its Vth exceeds a target verify voltage such as VvA-VvG (see FIG. 9B).

Figure 3:
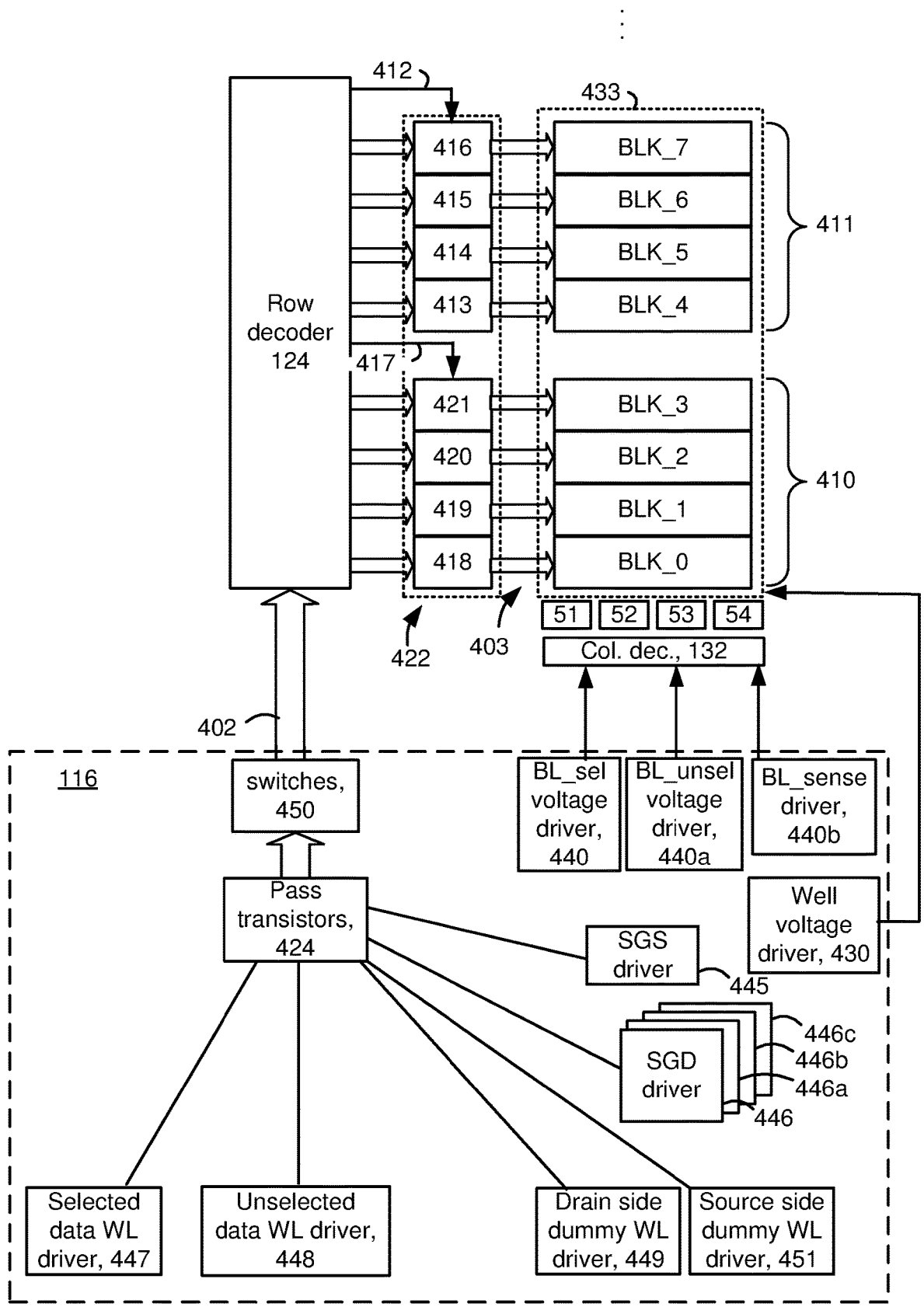
FIG. 3 depicts an example implementation of the power control module 116 of FIG. 1 for providing voltages to blocks of memory cells.

FIG. 3 depicts an example implementation of the power control module 116 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation. The voltage drivers can also include a driver 448 for unselected data word lines. These can be remaining, unselected word lines other than the selected word line. The voltage drivers can also include a drain-side dummy word line driver 449 which provides voltages on drain-side dummy word lines such as WLDD0 and WLDD1, and a source-side dummy word line driver 451 which provides voltages on source-side dummy word lines such as WLDS1 and WLDS0. See FIG. 5A.

The voltage drivers can also include separate SGD drivers for each sub-block in a block. For example, SGD drivers 446, 446a, 446b and 446c can be provided for SB0, SB1, SB2 and SB3, respectively, of BLK0 such as in FIG. 6-8. In one option, one SGS driver 445 is common to the different sub-blocks in a block. In another option, separate SGS drivers are provided for each sub-block of a block. Moreover, in some cases, such as a depicted in FIGS. 6 and 8, there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach. Or, for simplicity, the multiple SGD transistors may be connected and commonly driven, the multiple SGS transistors may be connected and commonly driven, the multiple drain side dummy memory cells may be connected and commonly driven and the multiple source side dummy memory cells may be connected and commonly driven.

The various components, including the row decoder, may receive commands from a controller such as the state machine 112 or the controller 122 to perform the functions described herein.

In one approach, the well region 433 (see also FIG. 5A) is common to the blocks and may be driven by a voltage driver 430. A set of bit lines is also shared by the blocks. During a program operation, a BL_sel bit line voltage driver 440 provides voltages to the selected bit lines and a BL_unsel bit line voltage driver 440a provides voltages to the unselected bit lines. These bit line drivers can also be disconnected from respective bit lines to allow the bit line voltage to float. In some cases, as mentioned, it is desirable to float the voltages of bit lines which are not connected to NAND strings. During a sensing operation, a BL_sense bit line voltage driver 440b provides voltages to the bit lines.

In a stacked memory device such as depicted in FIGS. 4 to 8, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach. The vertically extending NAND strings have a floating channel.

Figure 4:
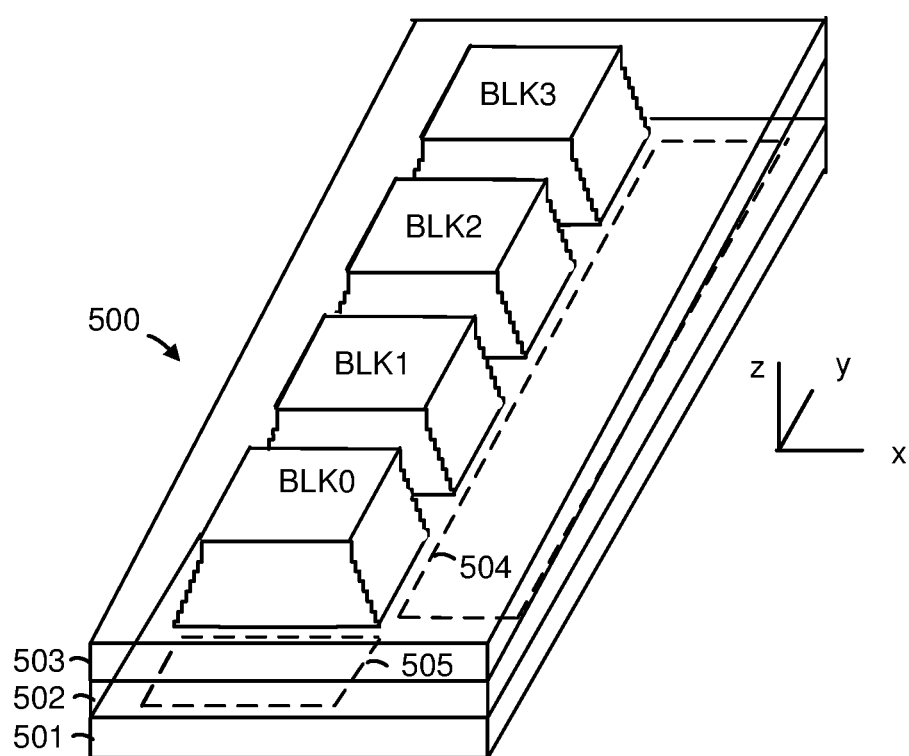
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate 501 are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5C:
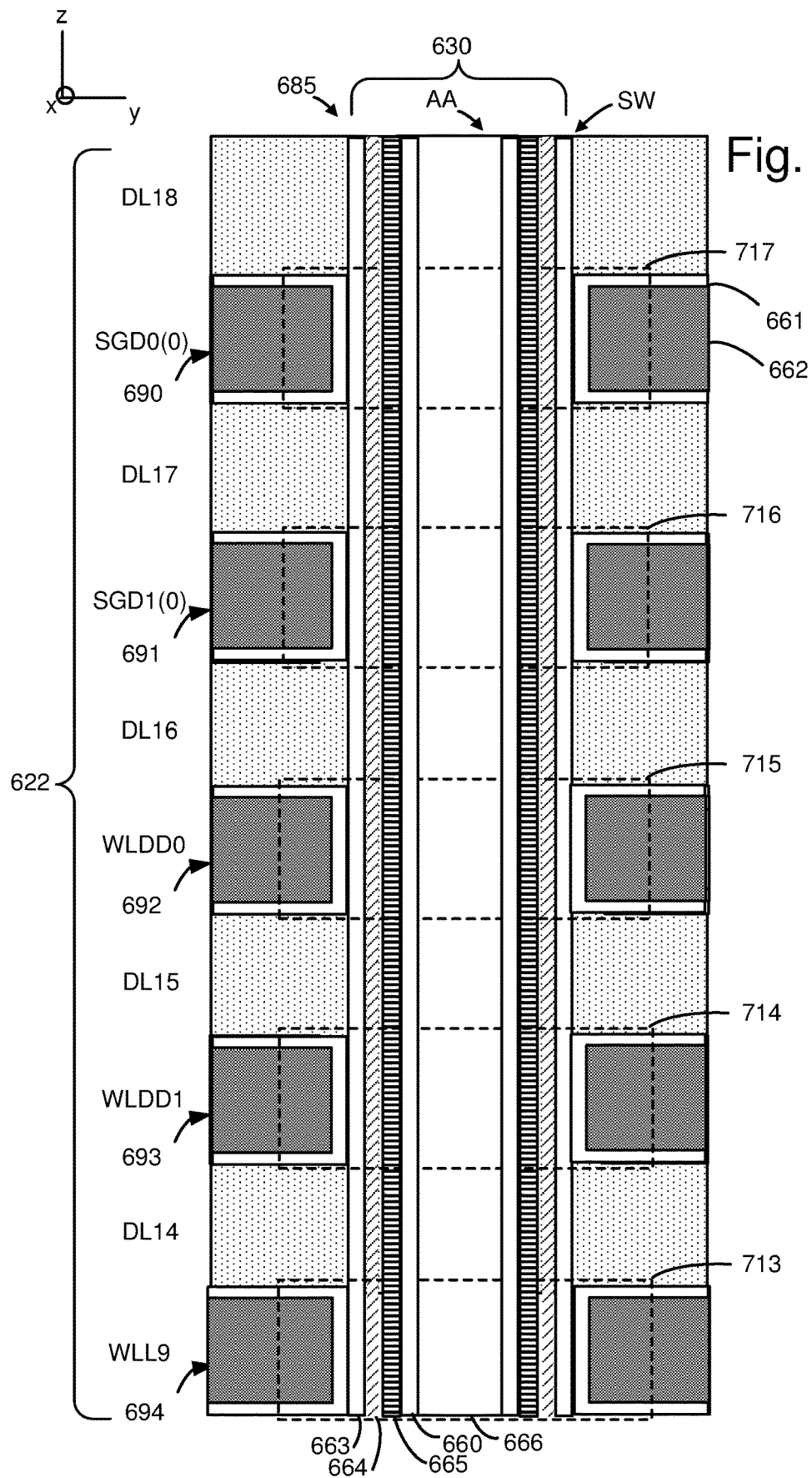
FIG. 5C depicts a close-up view of the region 622 of the stack of FIG. 5A.

FIG. 5A depicts an example cross-sectional view of a portion of BLK0 of FIG. 4, where NAND strings 700n and 710z are connected to a bit line BL0 by vias 621 and 621a, respectively. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and ten data word line layers (or data word lines) WLL0-WLL9. WLL0 is a source side data word line and WLDS1 is a dummy word line layer which is adjacent to the source side data word line. WLDS0 is another dummy word line layer which is adjacent to WLDS1. WLL9 is a drain side data word line and WLDD1 is a dummy word line layer which is adjacent to the drain side data word line. WLDD0 is another dummy word line layer which is adjacent to WLDD1. The dielectric layers are labelled as DL1-DL18. Further, regions of the stack which comprise NAND strings 700n and 710z are depicted. Each NAND string encompasses a memory hole 618 or 619 which is filled with materials which form memory cells adjacent to the word lines. Region 622 of the stack is shown in greater detail in FIG. 5C.

The stack includes a substrate 611. In one approach, a portion of the source line SL comprises a well region 433 (see also FIG. 3) as an n-type source diffusion layer or well in the substrate. The well region is in contact with a source end of each string of memory cells in a block. An erase pulse may be applied to this layer in an erase operation. The n-type well region 433 is formed in a p-type well region 611a, which in turn is formed in an n-type well region 611b, which in turn is formed in a p-type semiconductor substrate 611c, in one possible implementation. The n-type source diffusion layer may be shared by all of the blocks in a plane, in one approach.

NAND string 700n has a source-end 613 at a bottom 616b of the stack 616 and a drain-end 615 at a top 616a of the stack. NAND string 710z has a source-end 613a at the bottom 616b of the stack 616 and a drain-end 615a at the top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. Conductive vias 621 and 621a connect the drain-ends 615 and 615a of the NAND strings to BL0. The vias are conductive paths which connect the top of the NAND strings to the bit lines which extend horizontally over the stack. The vias may comprise metal, for example. A via may be connected at its bottom to a topmost SGD transistor (e.g., the drain terminal D of the SGD transistor, see FIG. 5B) of a NAND string and at its top to the bottom of a bit line. The vias may be formed in an insulative region 550 on the top of the stack by depositing the insulative region, forming a mask, etching through the mask to form voids, and filling the voids with metal or other conductive material. The vias may have a circular cross-section, in one approach.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

An insulation-filled region 614 separates the block into sub-blocks, where the NAND strings 700n and 710z are in different sub-blocks.

FIG. 5B depicts an example transistor 650. The transistor comprises a control gate CG, a drain D, a source S and a channel CH and may represent a memory cell or a select gate transistor, for example.

FIG. 5C depicts a close-up view of the region 622 of the stack of FIG. 5A. Memory cells are formed at the different levels of the stack at the intersection of a word line layer and a memory hole. In this example, SGD transistors 717 and 716 are provided above dummy memory cells 715 and 714 and a data memory cell 713. These SGD transistors are at the drain end of the NAND string.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., comprising a gate oxide which may degrade over time), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710z, 720n and 730n, respectively. The channel 700a extends continuously in the NAND strings 700n from the SGS transistor 701 to the SGD transistors 716 and 717. The channel 700a is continuous in that it is uninterrupted and can therefore provide a continuous conductive path in the NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 5D:
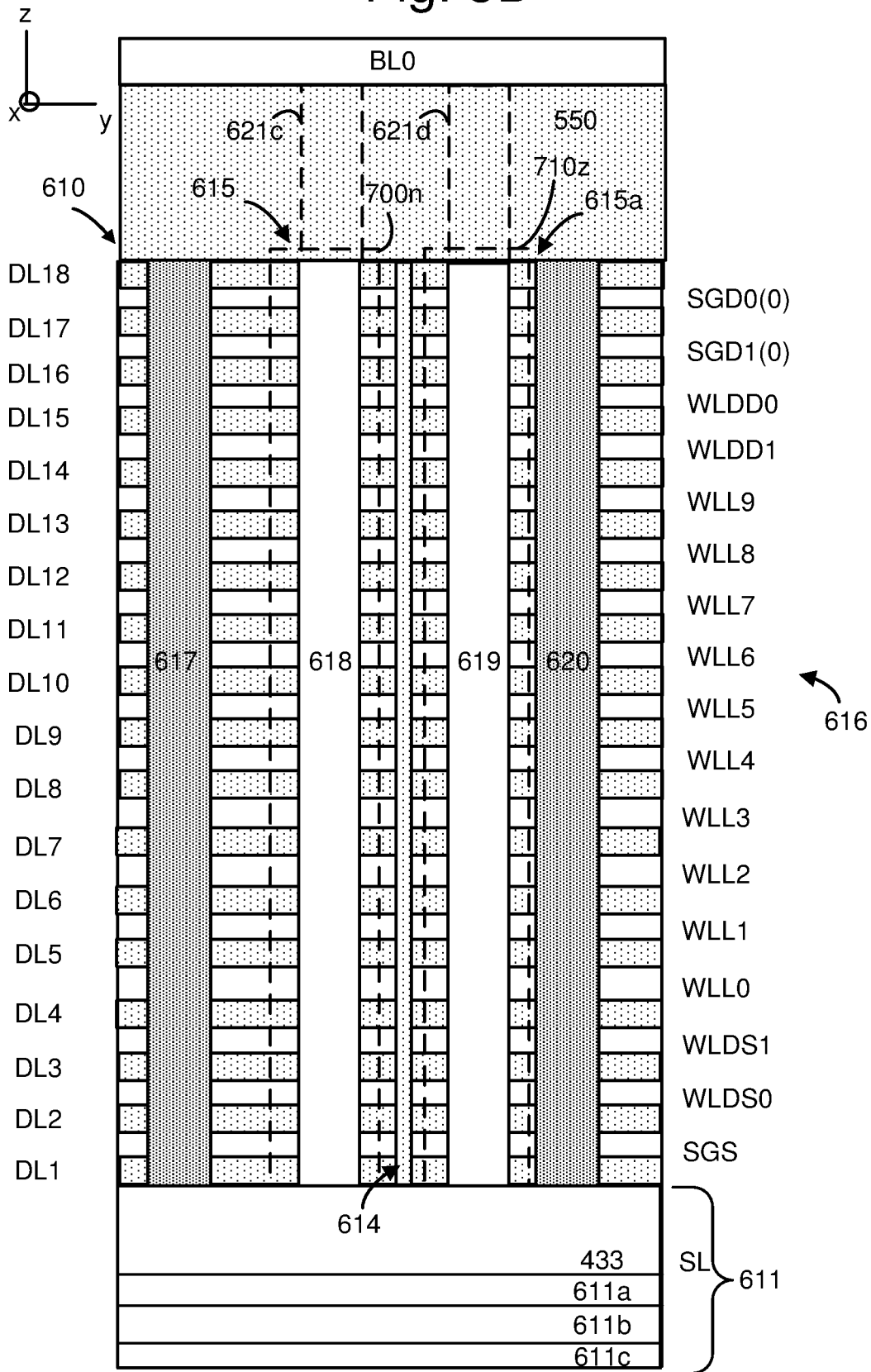
FIG. 5D depicts an example cross-sectional view of a portion of BLK0 of FIG. 4, where NAND strings 700$n$ and 710$z$ are disconnected from a bit line BL0.

FIG. 5D depicts an example cross-sectional view of a portion of BLK0 of FIG. 4, where NAND strings 700n and 710z are disconnected from a bit line BL0. In this case, vias are not formed in the insulative region 550 on the top of the stack, so that the NAND strings 700n and 710z are not connected to a bit line. Regions 621c and 621d represent portions of the insulative region 550 in which the vias would otherwise be fabricated. The NAND strings are dummy or sacrificial NAND strings because they cannot be accessed to read or write data. It may be desired to fabricate the dummy NAND strings and omit the fabrication of the vias rather than adjusting the fabrication process to avoid fabricating the dummy NAND strings. However, another option, shown in FIG. 12F, avoids fabricating the dummy NAND strings and the voids.

Figure 6:
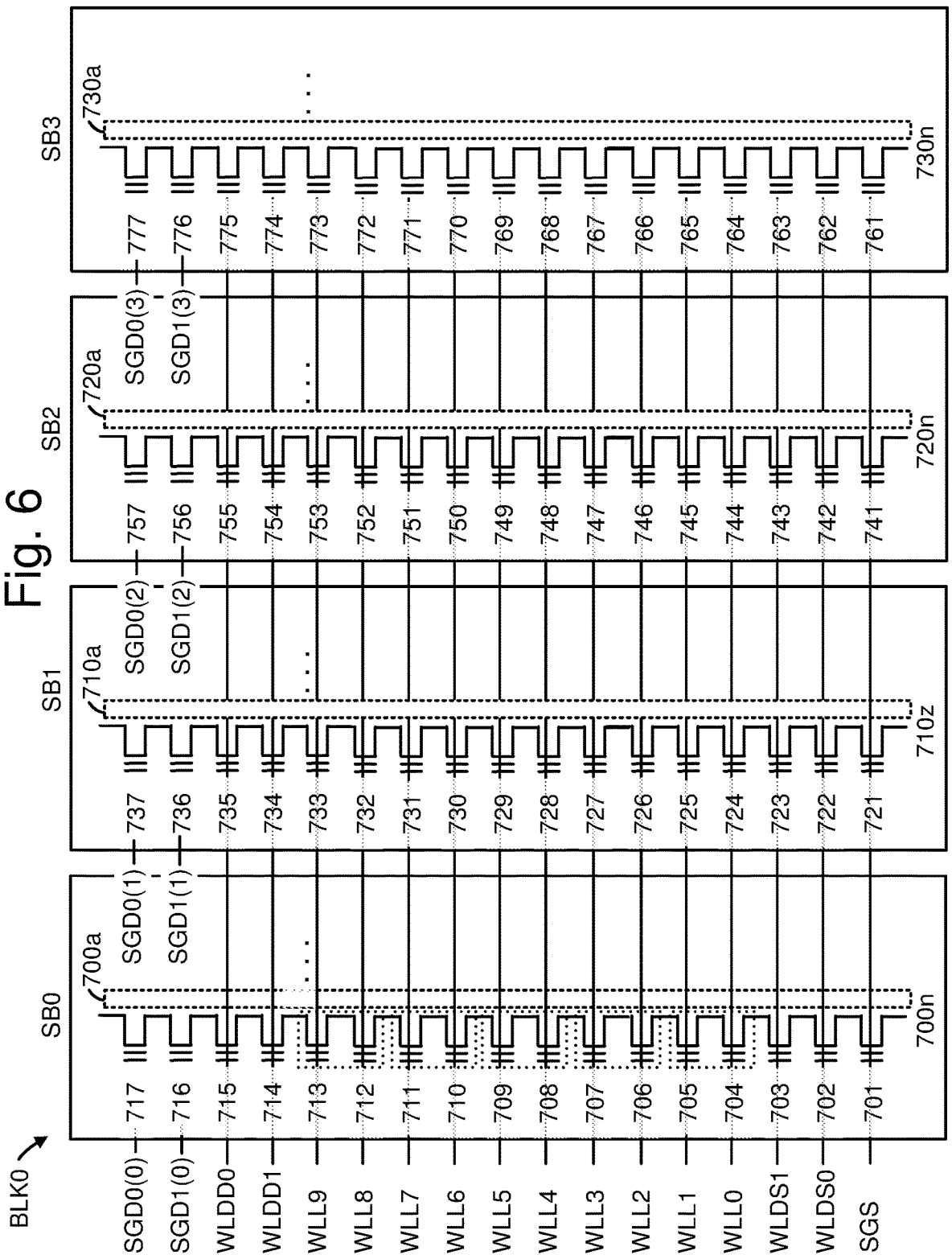
FIG. 6 depicts an example view of NAND strings in BLK0 which is consistent with FIGS. 4, 5A and 5D.

FIG. 6 depicts an example view of NAND strings in BLK0 which is consistent with FIGS. 4, 5A and 5D. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710z, 720n and 730n, respectively. The NAND strings have data word lines, dummy word lines and select gate lines consistent with FIG. 5A. Each sub-block comprises a set of NAND strings which extend in the x direction and which have a common SGD line or control gate layer. The NAND strings 700n, 710z, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. Another option programs all of the memory cells in one sub-block, one word line portion at a time, before programming the memory cells of the next sub-block. The word line programming order may start at WL0, the source-end word line and end at WLL9, the drain-end word line, for example.

The NAND strings 700n, 710z, 720n and 730n have channels 700a, 710a, 720a and 730a, respectively.

Additionally, NAND string 700n includes SGS transistor 701, dummy memory cells 702 and 703, data memory cells 704-713, dummy memory cells 714 and 715, and SGD transistors 716 and 717. NAND string 710z includes SGS transistor 721, dummy memory cells 722 and 723, data memory cells 724-733, dummy memory cells 734 and 735, and SGD transistors 736 and 737. NAND string 720n includes SGS transistor 741, dummy memory cells 742 and 743, data memory cells 744-753, dummy memory cells 754 and 755, and SGD transistors 756 and 757. NAND string 730n includes SGS transistor 761, dummy memory cells 762 and 763, data memory cells 764-773, dummy memory cells 774 and 775, and SGD transistors 776 and 777.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by separate control lines SGS(0), SGS(1), SGS(2) and SGS(3), respectively. In another approach, all of the SGS transistors in a block are connected and commonly driven.

Figure 7:
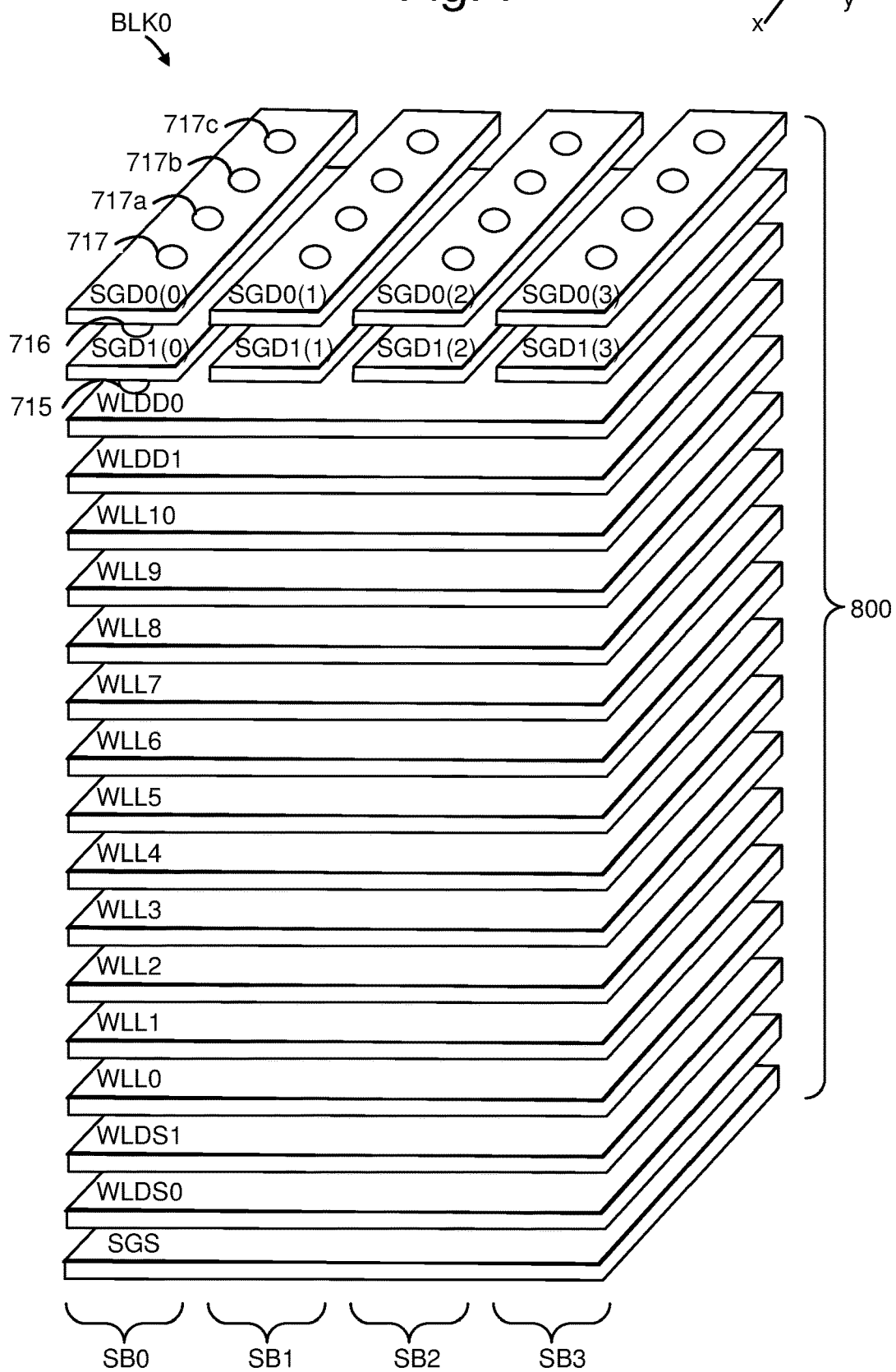
FIG. 7 depicts control gate layers in BLK0 consistent with FIG. 6.

FIG. 7 depicts control gate layers in BLK0 consistent with FIG. 6. The control gate layers are arranged in a stack 800 and include dummy word lines layers or control gate layers WLDS0, WLDS1, WLDD0 and WLDD1, and data word line layers or control gate layers WLL0-WLL9, which are shared among the different sub-blocks SB0-SB3. The control gate layers include a common SGS control gate layer for the block. Optionally, a separate SGS control gate layer could be provided for each sub-block. For example, SB0, SB1, SB2 and SB3 include SGD0(0) and SGD1(0), SGD0(1) and SGD1(1), SGD0(2) and SGD1(2), and SB3 SGD0(3) and SGD1(3), respectively. Additionally, four example memory holes are depicted in each sub-block. SGD transistors 717, 717a, 717b and 717c are depicted in SGD0(0), SGD transistor 716 is depicted in SGD1(0) and a dummy memory cell 715 is depicted in WLDD0.

Figure 8:
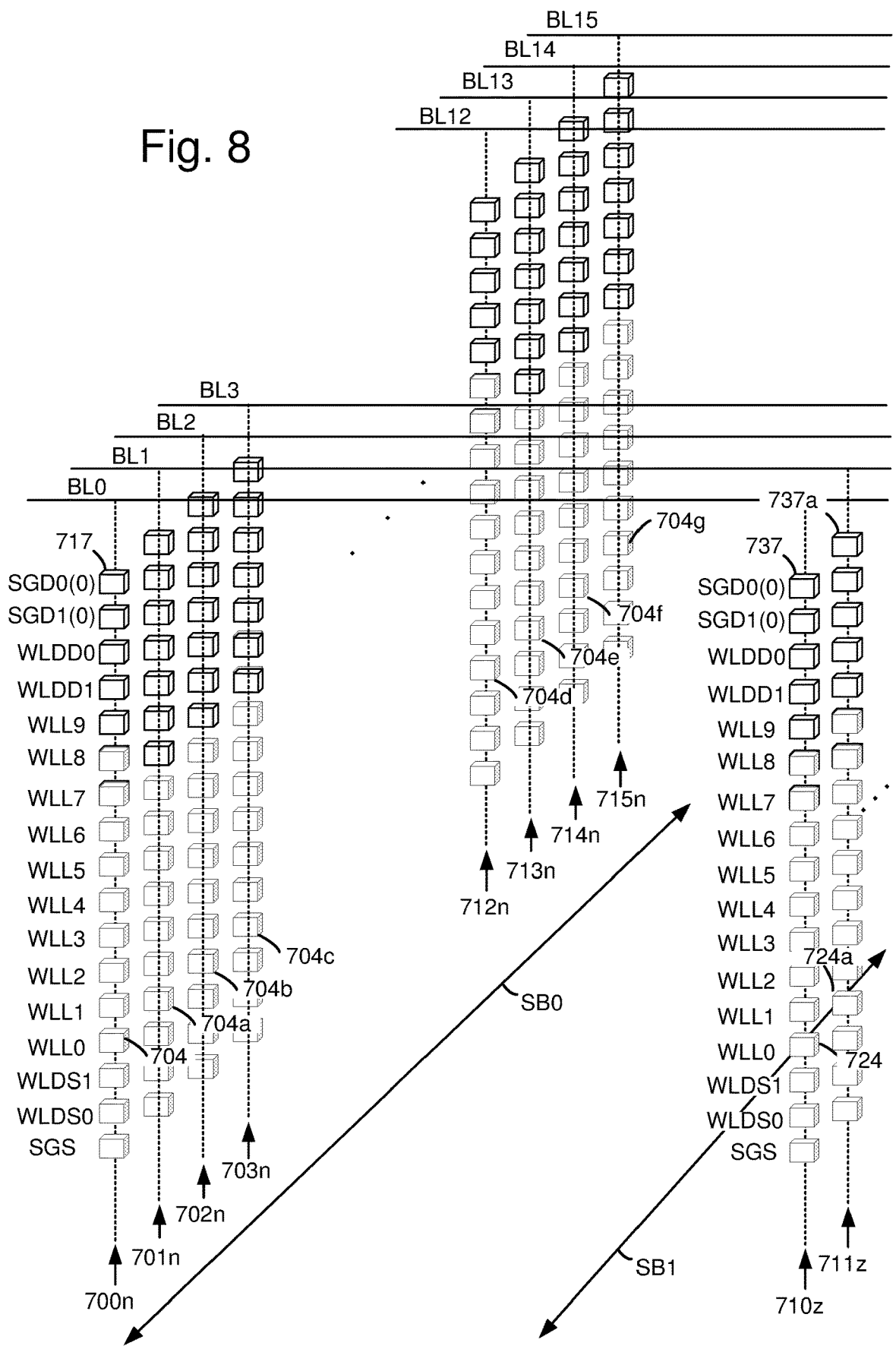
FIG. 8 depicts additional detail of SB0 and SB1 of FIGS. 6 and 7.

FIG. 8 depicts additional detail of SB0 and SB1 of FIGS. 6 and 7. The NAND string 700n of FIG. 6 is depicted along with additional NAND strings 701n-707n which are also in SB0. The NAND strings in a sub-block have SGD transistors with connected control gates. Each memory cell is depicted as a cube for simplicity. A bit line is connected to each respective NAND string. In this example, there are sixteen NAND strings connected to bit lines BL0-BL15. For example, BL0-BL3 are connected to NAND strings 700n-703n, respectively, and BL12-BL15 are connected to NAND strings 712n-715n, respectively. Sense circuits may be connected to each bit line. For example, the sense circuits 60-63 of FIG. 2 may be connected to bit lines BL0-BL3, respectively.

A set of memory cells is connected to each word line. For example a set of memory cells 704-704g is connected to WLL0 in NAND strings 700n-707n, respectively.

During a program operation, some of the NAND strings in a sub-block may be selected for programming when the associated latches have a program status, and other NAND strings in the sub-block may be unselected for programming when the associated latches have a lockout status. The NAND strings with a program or lockout status are data-storing NAND strings which are eligible to store data. For dummy NAND strings, which are ineligible to store data, the associated bit lines may be floated during program or read operations, in one approach, to reduce a capacitance experienced by the bit lines for data-storing NAND strings.

Examples NAND strings 710z and 711z in sub-block SB1 are also depicted, and have example memory cells 724 and 724a, respectively, connected to WLL0. During a program or read operation, one sub-block may be selected while other sub-blocks are unselected. Additionally, the memory cells connected to a selected word line are selected for the program or read operation while memory cells connected to the remaining, unselected word lines are unselected for the program or read operation.

FIG. 9A depicts threshold voltage (Vth) distributions 900 and 901 of SLC memory cells in an erased (Er) state and a programmed (P) state, respectively. In FIG. 9A-9C, the vertical axis depicts a number of memory cells on a logarithmic scale and the horizontal axis depicts the Vth on a linear scale. Initially, a block of memory cells is erased and the memory cells are in the Er state. The erase operation may use the erase-verify voltage VvEr to provide the Vth distribution 900. Subsequently, when a program operation is performed, some of the memory cells remain in the Er state while others are programmed to the P state in one or more program loops. The program operation may use the program-verify voltage VvP to provide the Vth distribution 901.

Figure 10A:
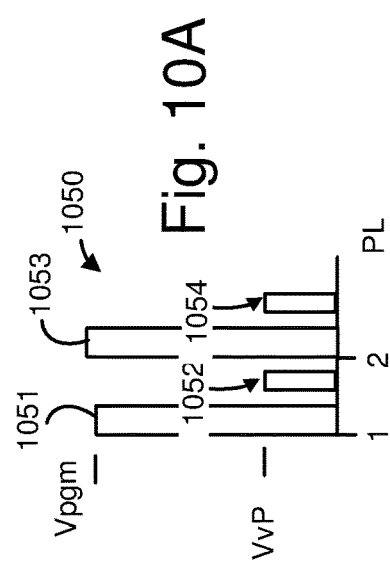
FIG. 10A depicts a voltage signal used in a series of program loops in an example program operation for SLC memory cells which results in the Vth distribution of FIG. 9A.
Figure 10B:
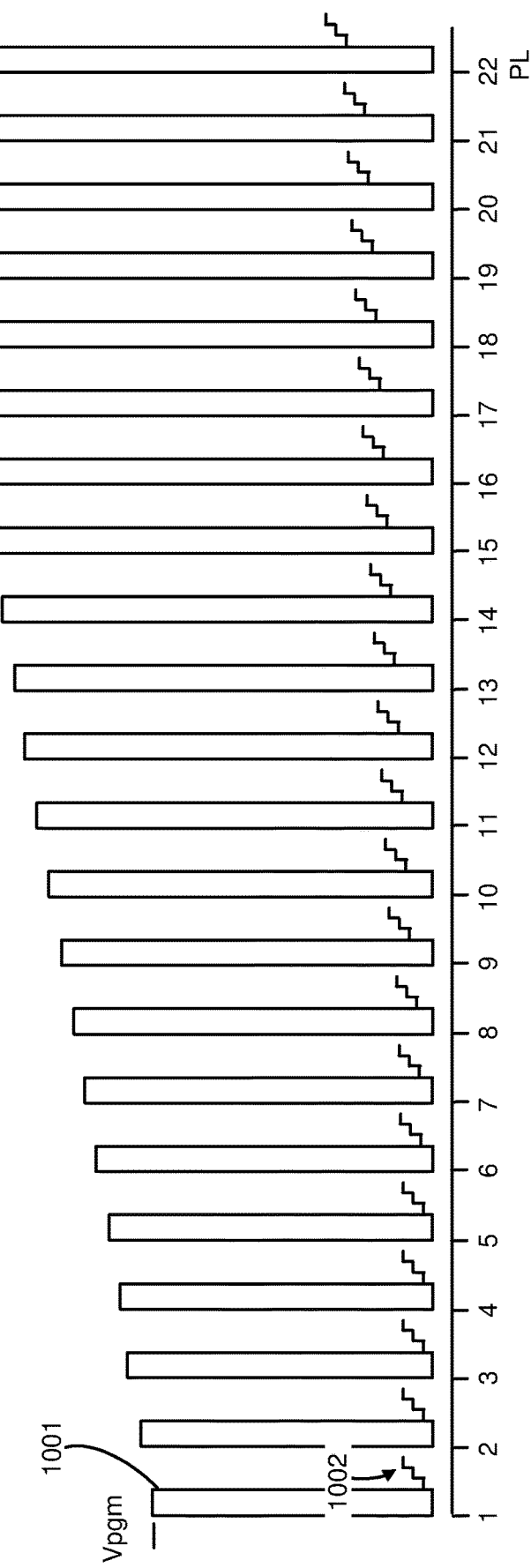
FIG. 10B depicts a voltage signal used in a series of program loops in an example program operation for MLC memory cells which results in the Vth distribution of FIG. 9B.

In this example, the memory cells are SLC memory cells which are programmed in one or two program loops, e.g., using one or two program voltages or pulses such as by using the voltage signal of FIG. 10A. For example, assume the Vth distribution 901 is obtained after one program pulse. A verify test may be performed after the first program pulse to ensure that Vth>VvP; otherwise, a second program pulse can be applied. The SLC memory cells thus can be programmed very quickly, compared to MLC memory cells which are programmed using several program pulses.

FIG. 9B depicts an example Vth distribution of a set of MLC memory cells in eight data states. In one approach, at a start of a program operation, the memory cells are all initially in the erased state as represented by the Vth distribution 910. After the program operation is successfully completed, the memory cells assigned to the Er state are represented by the Vth distribution 910a, where the Vth distribution is upshifted due to program disturb.

The memory cells which are programmed to the A, B, C, D, E, F and G states using verify voltages of VvA, VvB, VvC, VvD, VvE, VvF and VvG, respectively, are represented by the Vth distributions 911, 912, 913, 914, 915, 916 and 917, respectively. The verify voltages are used in the program-verify tests of the memory cells. Read voltages VrA, VrB, VrC, VrD, VrE, VrF and VrG can be used for reading the states of the memory cells in a read operation. These verify voltages and read voltages are examples of control gate read levels of the selected word line voltage.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr.

FIG. 9C depicts an example Vth distribution of select gate transistors. As described, e.g., in connection with FIG. 11F, dummy NAND strings can be created by programming their SGD transistors to a higher Vth distribution than the SGD transistors of data-storing NAND strings. For example, at the time of manufacture, or periodically during the lifetime of the memory device, the SGD transistors can be erased using an erase voltage VvEr to achieve the Vth distribution 920. Subsequently, the SGD transistors can be programmed using a voltage signal similar to that in FIGS. 10A and 10B. In particular, a verify voltage VvP1 or VvP2 can be used to achieve the Vth distribution 921 or 922, respectively, in states P1 or P2, respectively. The lower Vth distribution 921 is for dummy NAND strings and the higher Vth distribution 922 is for data-storing NAND strings.

Assume a sub-block comprises dummy NAND strings and data-storing NAND strings, and that the control gates of the SGD transistors are connected. The Vth of the P2 state (and VvP2) can be set higher than Vsgd_max, the highest SGD voltage which is applied when accessing the data-storing NAND strings. For example, Vsgd_max may be an SGD voltage applied during the pre-charge phase of a program operation (see Vsg in FIG. 15), or during a read operation (see Vsg in FIG. 16). In one example, Vsgd_max=6 V, and VvP2=6.5-7 V. With the SGD Vth set sufficiently high, the SGD transistors for the dummy NAND strings will remain in a non-conductive state throughout a program or read operation for a dummy NAND string connected to common bit lines, even with Vbl=0 V. In contrast, with a lower SGD Vth (e.g., 3 V), the SGD transistors for the data-storing NAND strings can transition between a conductive state, by applying Vbl=0 V, and a non-conductive state, by setting Vbl=2.5-3 V, for instance. An SGD transistor will be conductive when its control gate voltage (Vsg) is greater than the sum of the Vth and the drain voltage (e.g., Vbl). The Vth of the SGD transistors should not be too high to avoid disturb of neighboring transistors.

For a dummy NAND string with multiple SGD transistors, one or more can be provided with the high Vth as described.

FIG. 10A depicts a voltage signal used in a series of program loops in an example program operation for SLC memory cells which results in the Vth distribution of FIG. 9A. As mentioned, SLC programming can be relatively fast since it involves one or sometimes two program pulses, in one approach. In FIGS. 10A and 10B, the horizontal axis denotes a program loop number, and the vertical axis denotes voltage. The voltage signal 1050 includes a program pulse 1051 and program-verify voltage VvP 1052 in a first program loop, and a program pulse 1053 and program-verify voltage VvP 1054 in a second and final program loop. The voltage signal is applied to a word line which is selected for programming. The initial program voltage and the step size can be different for the SLC programming of FIG. 10A compared to the MLC programming of FIG. 10B.

FIG. 10B depicts a voltage signal used in a series of program loops in an example program operation for MLC memory cells which results in the Vth distribution of FIG. 9B. During a program operation, program loops are performed for a selected word line in a selected block. A program loop comprises a program portion in which a program voltage or pulse is applied to the selected word line followed by a verify portion in which a verify signal is applied to the selected word line while one or more verify tests, referred to as program-verify tests, are performed for the associated memory cells. Other than the erased state, each assigned state has a verify voltage which is used in the verify test for the state in a program operation.

The voltage signal 1000 includes a series of program voltages, including an initial program voltage 1001, which are applied to a word line selected for programming. In this example, the voltage signal includes program voltages which increase stepwise in amplitude in one or more program loops of a programming pass using a fixed or varying step size. This is referred to as incremental step pulse programming, where the program voltage starts at an initial voltage (see program voltage 1001) and increases in a step in each successive program loop, for instance, until the program operation is completed. The operation is successfully completed when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 1002, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification. See also the verify phase of FIG. 15.

All memory cells may initially be in the erased state at the beginning of the program operation, for instance. After the program operation is completed, the data can be read from the memory cells using read voltages which are between the Vth distributions. At the same time, a read pass voltage, Vread (e.g., 8-10 V), also referred to as pass voltage or turn-on voltage, is applied to the remaining (unselected) word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. See also FIG. 21. The data of the middle page can be determined by reading the memory cells using read voltages of VrB, VrD and VrF. The data of the upper page can be determined by reading the memory cells using read voltages of VrC and VrG.

Figure 11A:
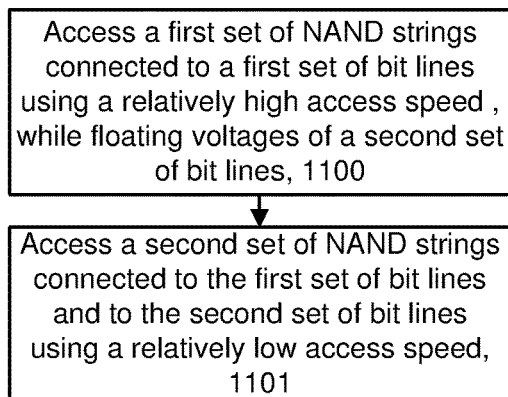
FIG. 11A depicts an example process for accessing a first set of NAND strings using a relatively high access speed, and a second set of NAND strings using a relatively low access speed.

FIG. 11A depicts an example process for accessing a first set of NAND strings using a relatively high access speed, and a second set of NAND strings using a relatively low access speed. Step 1100 includes accessing a first set of NAND strings connected to a first set of bit lines using a relatively high access speed, while floating voltages of a second set of bit lines. A relatively high access speed refers to changing a bit line voltage from an existing voltage to a requested voltage in a relatively short time period. See FIG. 14. Step 1101 includes accessing a second set of NAND strings connected to the first set of bit lines and to a second set of bit lines using a relatively low access speed. The second set of bit lines is either not connected to the first set of NAND strings, or is connected to SGD transistors of the first set of NAND strings but these SGD transistors are in a non-conductive state due to their high Vth so that the second set of bit lines is not electrically connected to the memory cells of the first set of NAND strings. In other words, the second set of bit lines is not electrically connected to a channel of the memory cells of the first set of NAND strings. The lack of an electrical connection between two points in the memory device refers to the lack of a conductive path between the two points. The accessing can include programming or read operations, for example. Moreover, the sets of NAND strings can be accessed alternatingly, repeatedly or sequentially, in any order.

For instance, in FIG. 12A, a first set of NAND strings can include NAND strings 700n, 702n, 704n, 706n, 708n, 710n, 712n and 714n in BLK0, and a second set of NAND strings can include NAND strings 790-790p in BLK1. A first set of bit lines can include BL0, BL2, BL4, BL6, BL8, BL10, BL12 and BL12, e.g., even-numbered bit lines, and a second set of bit lines can include BL1, BL3, BL5, BL7, BL9, BL11, BL13 and BL15, e.g., odd-numbered bit lines. Step 1100 can involve changing a voltage, or otherwise driving a voltage, on the even-numbered bit lines in connection with accessing the first set of NAND strings, while floating a voltage on the odd-numbered NAND strings. Step 1101 can involve changing a voltage, or otherwise driving a voltage, on each of the bit lines in connection with accessing the second set of NAND strings.

Figure 11B:
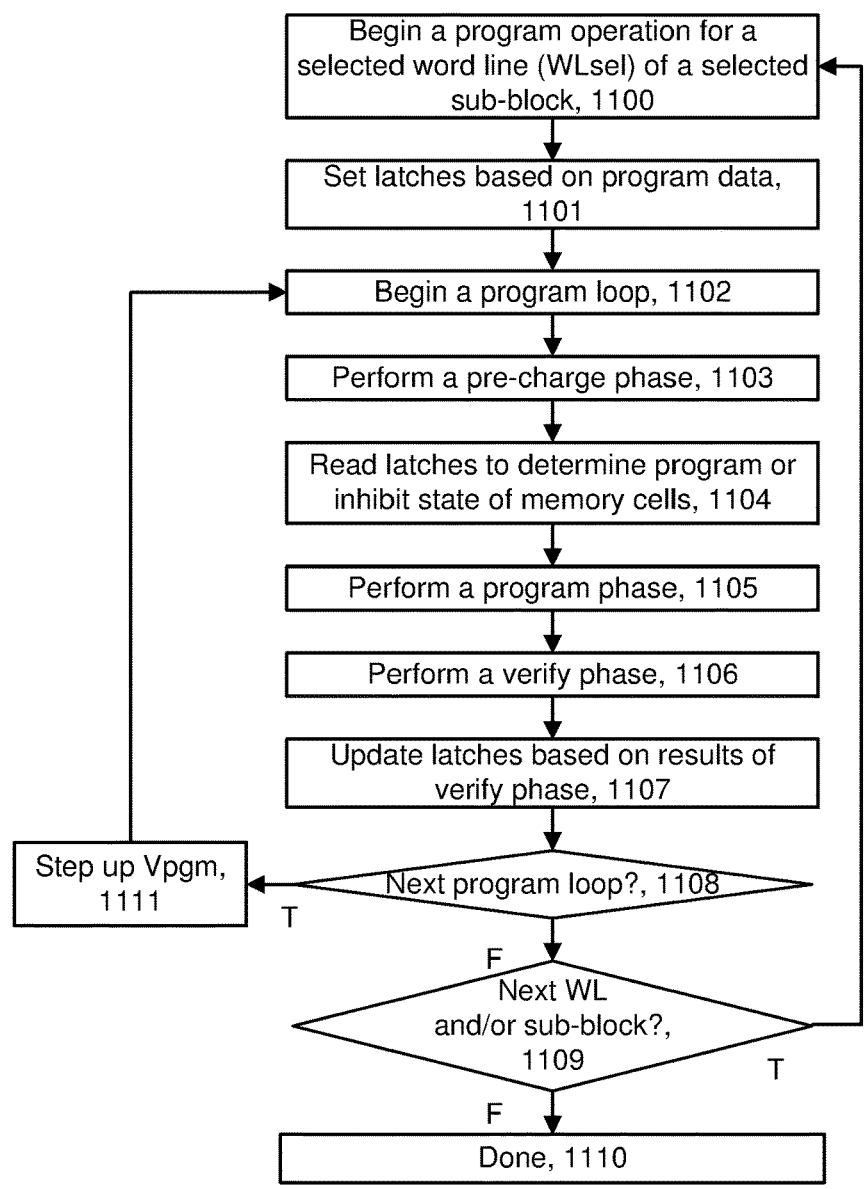
FIG. 11B depicts an example program operation which can implement the process of FIG. 11A.

FIG. 11B depicts an example program operation which can implement the process of FIG. 11A. Step 1100 begins a program operation for a selected word line (WLsel) of a selected sub-block. Step 1101 sets latches for the selected memory cells based on program data. For example, the latches may designate a data state which is assigned to a memory cell. If the data state is the erased state, the latches designate that the memory cell has a lockout status and should be inhibited from programming. If the data state is a programmed state, the latches designate that the memory cell has a program status and should be programmed. Step 1102 begins a program loop for WLsel. Step 1103 includes performing a pre-charge phase. See FIG. 15 at t0-t3. Step 1104 includes reading the latches of the selected memory cells, e.g., to determine whether the memory cells are in a lockout or program state. Step 1105 includes performing a program phase. See FIGS. 11C and 11D, and FIG. 15 at t3-t8. Step 1106 includes performing a verify phase. See FIGS. 11C and 11D, and FIG. 15 at t8-t16.

Step 1107 includes updating the latches based on the results of the verify tests in the verify phase. For example, the latches can be updated from the program state to the lockout state for memory cells which pass a verify test at step 1106. A decision step 1108 determines if there is a next program loop. A next program loop may be performed if many memory cells have not completed programming, e.g., are in the program state. If this is true, step 1111 includes stepping up Vpgm, and a next program loop begins at step 1102. If decision step 1108 is false, a decision step 1109 determines if there is a next word line and/or sub-block to program. If the decision step 1109 is true, another program operation begins at step 1100. If the decision step 1109 is false, step 1110 denotes the end of the program operation.

Figure 11C:
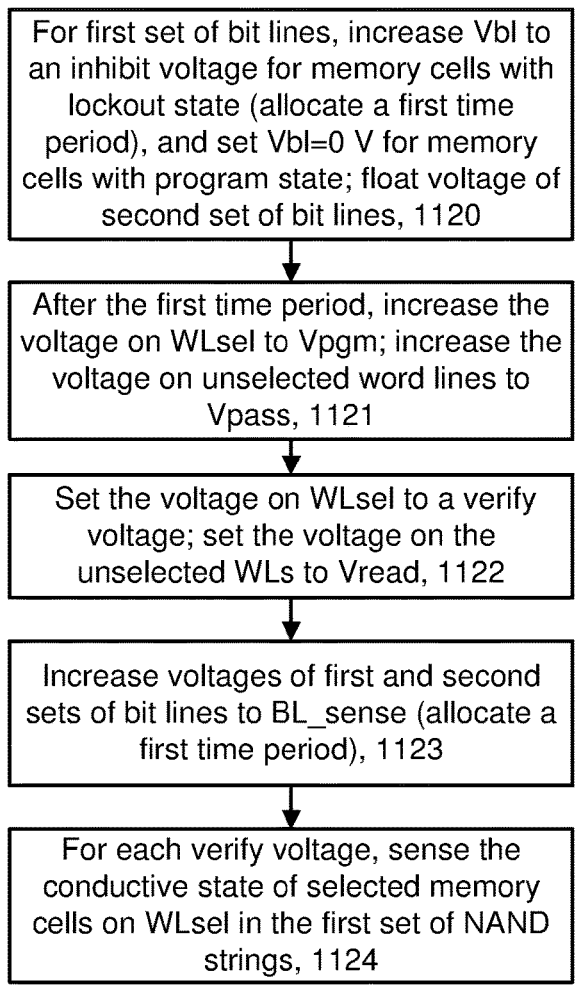
FIG. 11C depicts an example implementation of the program and verify phases of FIG. 11B using a relatively high access speed.

FIG. 11C depicts an example implementation of the program and verify phases of FIG. 11B using a relatively high access speed. For example, this could apply to SLC memory cells in a first set of NAND strings connected to a first set of bit lines. The program phase includes steps 1120 and 1121, and the verify phase includes steps 1122-1124. Step 1120 includes, for the first set of bit lines, increasing Vbl to an inhibit voltage (e.g., 2 V) for memory cells with a lockout state (e.g., by allocating a first time period for this voltage increase such as t2-t3 in FIG. 15), and setting Vbl=0 V for memory cells with a program state. Concurrently, the step includes floating voltages of a second set of bit lines. This reduces an inter-bit line capacitance. Step 1121 includes, after the first time period, increasing the voltage on WLsel to Vpgm, and increasing the voltage on the unselected word lines to Vpass.

Subsequently, the voltages on the word lines and the first set of bit lines may be decreased back to the initial voltage, e.g., 0 V. See FIG. 15 at t8. The verify phase occurs next. Step 1122 includes setting the voltage on WLsel to a verify voltage (e.g., VvE, VvF or VvG in FIG. 15), and setting the voltage on the unselected WLs to Vread. Step 1123 includes increasing the voltages of the first and second sets of bit lines to BL_sense, discussed previously in connection with FIG. 2, (e.g., by allocating a first time period for this increase, such as t9-t10 in FIG. 15). As mentioned, when sensing the first set of NAND strings, inter-bit line capacitance can be reduced by driving the first and second sets of bit lines at the same voltage, while the second set of bit lines are disconnected from the memory cell channels of the respective NAND strings. Step 1124 includes, for each verify voltage, sensing the conductive state of the selected memory cells on WLsel in the first set of NAND strings.

In steps 1120 and 1123, the first time period can be the same or different. Generally for a given change in Vbl, e.g., an increase or decrease, a given first time period can be allocated, when using the relatively high access speed. The first time period can be allocated in proportion to the change in Vbl.

Figure 11D:
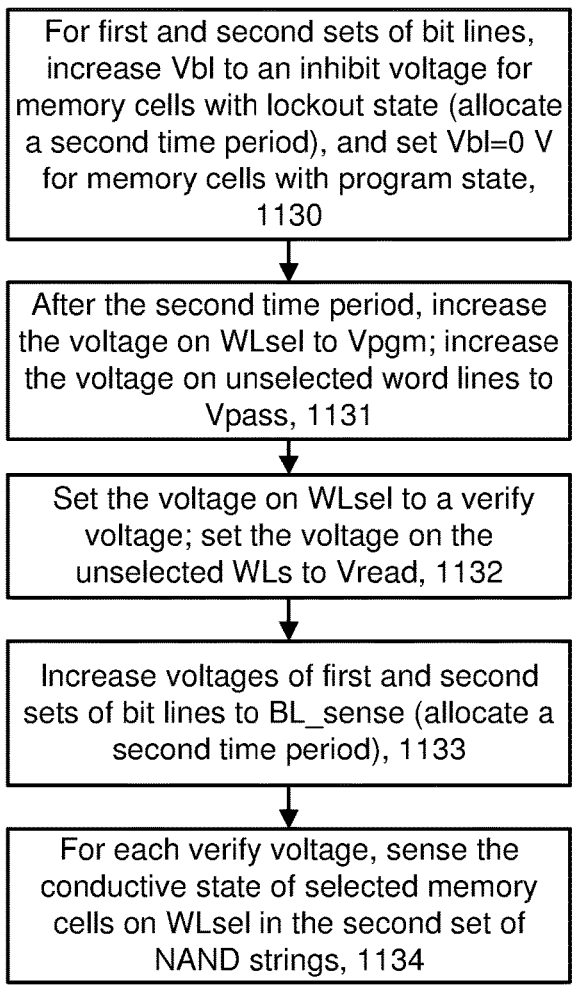
FIG. 11D depicts an example implementation of the program and verify phases of FIG. 11B using a relatively low access speed.

FIG. 11D depicts an example implementation of the program and verify phases of FIG. 11B using a relatively low access speed. For example, this could apply to MLC memory cells in a second set of NAND strings connected to first and second sets of bit lines. The program phase includes steps 1130 and 1131, and the verify phase includes steps 1132-1134. Step 1130 includes, for the first and second sets of bit lines, increasing Vbl to a program inhibit voltage for memory cells with a lockout state (e.g., by allocating a second time period for this voltage increase such as t2-t3 in FIG. 15), and setting Vbl=0 V for memory cells with a program state. The second time period can be greater than the first time period in FIG. 11C due to the larger RC time constant of the bit lines when accessing the second set of NAND strings. Step 1131 includes, after the second time period, increasing the voltage on WLsel to Vpgm, and increasing the voltage on the unselected word lines to Vpass.

Subsequently, the voltages on the word lines and the first set of bit lines may be decreased back to the initial voltage. See FIG. 15 at t8. The verify phase occurs next. Step 1132 includes setting the voltage on WLsel to a verify voltage and setting the voltage on the unselected WLs to Vread. Step 1133 increasing the voltages of the first and second set of bit lines to a BL_sense (e.g., by allocating a second time period for this increase, such as t9410 in FIG. 15). Step 1134 includes, for each verify voltage, sensing the conductive state of the selected memory cells on WLsel in the second set of NAND strings.

In steps 1130 and 1133, the second time period can be the same or different. For a given change in Vbl, e.g., an increase or decrease, a given second time period can be allocated when using the relatively low access speed. The second time period can be allocated in proportion to the change in Vbl.

FIG. 11E depicts an example read operation which can implement the process of FIG. 11A. A read operation begins at step 1140. Step 1141 includes setting the voltage on WLsel to a read voltage, and setting the voltage on the unselected WLs to Vread. See FIG. 16 and the example read voltages of VrA and VrE. Step 1142 includes setting voltages of sense circuits. For example, a sense circuit may include a sense node which is charged up to a specified voltage. See FIG. 2. Subsequently, steps 1143a and 1144a, or 1143b and 1144b, can be followed for a relatively high or low access speed read operation, respectively. Step 1143a includes increasing voltages of the first and second sets of bit lines to BL_sense (e.g., by allocating a first time period for the increase, such as t2-t3 in FIG. 16). Step 1144a involves reading the first set of NAND strings. It includes, for each read voltage, sensing the conductive state of the selected memory cells in the first set of NAND strings.

Step 1143b includes increasing voltages of the first and second sets of bit lines to BL_sense (e.g., by allocating a second time period for the increase, such as t2-t3 in FIG. 16). Step 1144b involves reading the second set of NAND strings. It includes, for each read voltage, sensing the conductive state of the selected memory cells in the second set of NAND strings.

Step 1145 includes storing the read results in the latches. For example, a single bit can be stored for each read voltage to indicate whether a memory cell is in a conductive or non-conductive state when the read voltage is applied. The read operation is done at step 1146.

Another approach is to provide a voltage kick for the voltages of the second set of bit lines when reading the first set of NAND strings connected to the first set of bit lines. This can help couple up the voltage of the first set of bit lines to reduce the ramp up time. See FIG. 16, plot 1680a. A voltage kick could also be provided for the voltages of the first set of bit lines.

FIG. 11F depicts an example program operation for SGD transistors, consistent with FIG. 9C. As mentioned, a dummy NAND string can be reversibly created in which the channel of the memory cells is electrically disconnected from the respective bit line by providing the SGD transistor of the dummy NAND string with a sufficiently high Vth to keep the SGD transistor in a non-conductive state. The SGD transistor of the data-storing NAND string has a lower Vth which allows the SGD transistor to transition between a conductive state (when the data-storing NAND string is selected for programming or reading) and a non-conductive state (when the data-storing NAND string is unselected for programming or reading). Step 1150 includes programming SGD transistors in a first set of NAND strings (which are connected to a first set of bit lines) using a lower verify voltage (VvP1), and step 1151 includes programming SGD transistors in dummy NAND strings which are interleaved with the first set of NAND strings (and connected to a second set of bit lines), using a higher verify voltage (VvP2), where VvP2>VvP1. As mentioned, an incremental step pulse programming process can be used, such as in FIG. 10A or 10B.

FIG. 12A depicts a top view of the set of blocks BLK0-BLK3 of FIG. 4, including NAND strings and their connections to bit lines, in an example configuration of a memory device for implementing the process of FIG. 11A with high and low access speed blocks. The NAND strings are represented by circles. A number of blocks are arranged in a plane, and each block includes sub-blocks. BLK0, BLK1, BLK2 and BLK3 include sub-blocks SB0-SB3, SB4-SB7, SB8-SB11 and SB12-SB15, respectively. Additionally, a row decoder is associated with each block. The row decoders alternate between the left and right hand side of the blocks to allow extra room for the layout of the row decoders. In another option, the row decoders are all on the same side of the blocks. The row decoders 124a-124d are associated with blocks BLK0-BLK3, respectively. The row decoders are connected to example contacts which are represented by squares.

In this simplified example, each sub-block includes sixteen NAND strings. Similarly, there are sixteen bit lines BL0-BL15 which are shared by the different blocks. The bit lines are connected to the column decoder 132, discussed in connection with FIG. 1. The column decoder receives VBL_sel and VBL_unsel from the bit line drivers 440 and 440a, respectively, and can route the voltages to sense circuits 60-75 in a set of sense circuits 99. Each sense circuit in turn can route one of the bit line voltages to a respective bit line based on a flag, as discussed in connection with FIG. 2. A path 132a extends between the column decoder and the sense circuits, and a path 118 extends between the column decoder and the controller 122 (FIG. 1).

In one example, BLK0 (one block) is used for relatively high access speed with SLC memory cells, and BLK1-BLK3 (another block) are used for relatively low access speed with MLC memory cells. In this case, a number of bits stored per memory cell (a storage density) in a second block (BLK1-BLK3) is greater than in a first block (BLK0). The high access speed block or blocks may be closest to the column decoder 132 to minimize RC delays during voltage changes on the bit lines. For example, BLK0 may be selected for relatively high access speed because it is the closest block to the column decoder, and therefore to the bit line drivers. BLK0 is at a distance d1 (or a range of distances d1-d2) from the column decoder, and BLK1 is at a greater distance d3>d1 (or a range of distances d3-d4) from the column decoder. These distances are marked along a vertical axis which represents a distance from the column decoder.

With one bit stored in every other memory cell in BLK0, the effective storage density is one half bit per memory cell.

In one option, different time periods can be allocated for changing a bit line voltage based on a distance of a block from the read/write circuits, with a shorter time being allocated when the distance is smaller.

Further, the high access speed block can be used as a cache for the lower speed blocks. See FIG. 12B. For example, in a program operation for a lower speed block, the data can be initially programmed to a higher speed block, which acts as a cache, and then transferred to the lower speed block. It is also possible for data to be initially programmed to a higher speed portion of a block, such as one sub-block, and then transferred to a lower speed portion of the block, such as another sub-block. These approaches allow the external controller to realize a relatively high access speed by programming and reading memory cells with high access speed, and then turn its attention to other tasks while data is subsequently moved internally within a block or between blocks to memory cells with lower access speed.

Example NAND strings 700*n*-715*n* are provided in SB0 in BLK0, a high access speed block, consistent with FIG. 8. Example NAND strings 790-790*p* are provided in SB4 in BLK1, a low access speed block. The open circles represent data-storing NAND strings and the shaded circles represent dummy NAND strings. For instance, SB0 includes data-storing NAND strings (e.g., non-dummy NAND strings, active NAND strings or NAND strings eligible to store data) 700*n*, 702*n*, 704*n*, 706*n*, 708*n*, 710*n*, 712*n*, and 714*n*, and dummy NAND strings 701*n*, 703*n*, 705*n*, 707*n*, 709*n*, 711*n*, 713*n* and 715*n*. The data-storing NAND strings are interleaved with the dummy NAND strings, with one dummy NAND string between a pair of adjacent data-storing NAND strings. In other words, NAND strings in a first set of NAND strings 700*n*, 702*n*, 704*n*, 706*n*, 708*n*, 710*n*, 712*n*, and 714*n* are interleaved with dummy NAND strings 701*n*, 703*n*, 705*n*, 707*n*, 709*n*, 711*n*, 713*n* and 715*n*.

In another option, there is more than one dummy NAND string between a pair of adjacent data-storing NAND strings. Also, the NAND strings in a sub-block are shown as being aligned in the x-direction, with one bit line extending directly over the top of a NAND string, but other arrangements are possible. For example, the NAND strings in a sub-block can be staggered to provide a denser layout.

The sub-blocks of BLK0 are uniformly configured with data-storing NAND strings alternating with dummy NAND strings. The sub-blocks of BLK1-BLK2 are also uniformly configured with successive data-storing NAND strings and no dummy NAND strings.

In this example, as mentioned in connection with FIG. 11A, a first set of bit lines can include BL0, BL2, BL4, BL6, BL8, BL10, BL12 and BL12, e.g., even-numbered bit lines, and a second set of bit lines can include BL1, BL3, BL5, BL7, BL9, BL11, BL13 and BL15, e.g., odd-numbered bit lines. The first set of bit lines are connected to data-storing NAND strings in each block and sub-block. The second set of bit lines are connected to data-storing NAND strings in BLK1-BLK3 but not in BLK0. Instead, the second set of bit lines are connected to dummy NAND strings in BLK0. The second set of bit lines are active when any one of BLK1-BLK3 is selected and inactive when BLK0 is selected. The first set of bit lines are active when any one of BLK0-BLK3 is selected.

FIG. 12B depicts an example architecture consistent with FIG. 12A. The approach of FIG. 12A allows for a memory device on one chip to provide high and low access speeds. Computing systems are often limited by the access speed of their memory rather than by CPU speed. One approach is to provide a dedicated cache such as storage class memory or SLC fast cache on one chip for use by a lower speed memory on another chip. However, this results in performance and costs penalties due to interconnections between the chips and associated RC delays. Also, the fabrication process is more complex. Instead, as described herein, by using a portion of the memory cells on a chip as a high access speed cache while another portion is used for long term storage, costs can be reduced while a competitive cache speed and a compact architecture are achieved.

The example architecture combines CPUs and memory devices in four units 1230*a*-1230*d* to allow data transfer between the memory devices.

In particular, in a unit 1230*a*, a CPU 1230 can be provided with a high access speed cache such as an L1, L2 or L3 cache 1231. The CPU could be the processor 122*c* in the off-chip controller 122 of FIG. 1, for example. A memory 1232 represents the set of blocks of FIG. 12A on a common chip, while the cache 1233 represents a portion of the blocks which provide high access speeds. This could be one or more high access speed SLC blocks with connected word lines or a portion of a block with SLC memory cells on connected word lines, for example. A remaining portion of the memory may include lower speed MLC blocks with disconnected word lines, or portion of a block with MLC memory cells on disconnected word lines, for example.

Similarly, a unit 1230*b* includes a CPU 1236 with an L1, L2 or L3 cache 1237, and a memory 1234 with a cache 1235, a unit 1230*c* includes a CPU 1238 with an L1, L2 or L3 cache 1239, and a memory 1240 with a cache 1241, and a unit 1230*d* includes a CPU 1244 with an L1, L2 or L3 cache 1245, and a memory 1242 with a cache 1243. The memory devices 1232, 1234, 1240 and 1242 may communicate with one another to transfer data.

FIG. 12C depicts an example computing-centric architecture. This approach includes a memory on one chip and a CPU on another chip, with a DRAM between them. The CPU includes an L1, L2 or L3 cache. As mentioned, this approach has overhead costs due to the cache and the memory being on different chips. In particular, a unit 1260*a* includes a CPU 1262 (with an L1, L2 or L3 cache 1263), a memory 1260 and a DRAM 1261 between the CPU and the memory. A unit 1260*b* includes a CPU 1264 (with an L1, L2 or L3 cache 1265), a memory 1267 and a DRAM 1266 between the CPU and the memory. A unit 1260*c* includes a CPU 1272 (with an L1, L2 or L3 cache 1273), a memory 1270 and a DRAM 1271 between the CPU and the memory. A unit 1260*d* includes a CPU 1274 (with an L1, L2 or L3 cache 1275), a memory 1277 and a DRAM 1276 between the CPU and the memory. The CPUs 1262, 1264, 1272 and 1274 may communicate with one another.

FIG. 12D depicts an example memory-centric architecture. This approach includes a memory on one chip and a CPU on another chip, with a cache between them. This approach also has overhead costs due to the CPU cache and the memory being on different chips. A unit 1280*a* includes a CPU 1280 (with an L1, L2 or L3 cache 1281), a memory 1283 and a cache 1282 between the CPU and the memory. A unit 1280*b* includes a CPU 1286 (with an L1, L2 or L3 cache 1287), a memory 1284 and a cache 1285 between the CPU and the memory. A unit 1280c includes a CPU 1288 (with an L1, L2 or L3 cache 1289), a memory 1291 and a cache 1290 between the CPU and the memory. A unit 1280d includes a CPU 1294 (with an L1, L2 or L3 cache 1295), a memory 1292 and a cache 1293 between the CPU and the memory. The memory devices 1283, 1284, 1291 and 1292 may communicate with one another to transfer data.

Figure 12E:
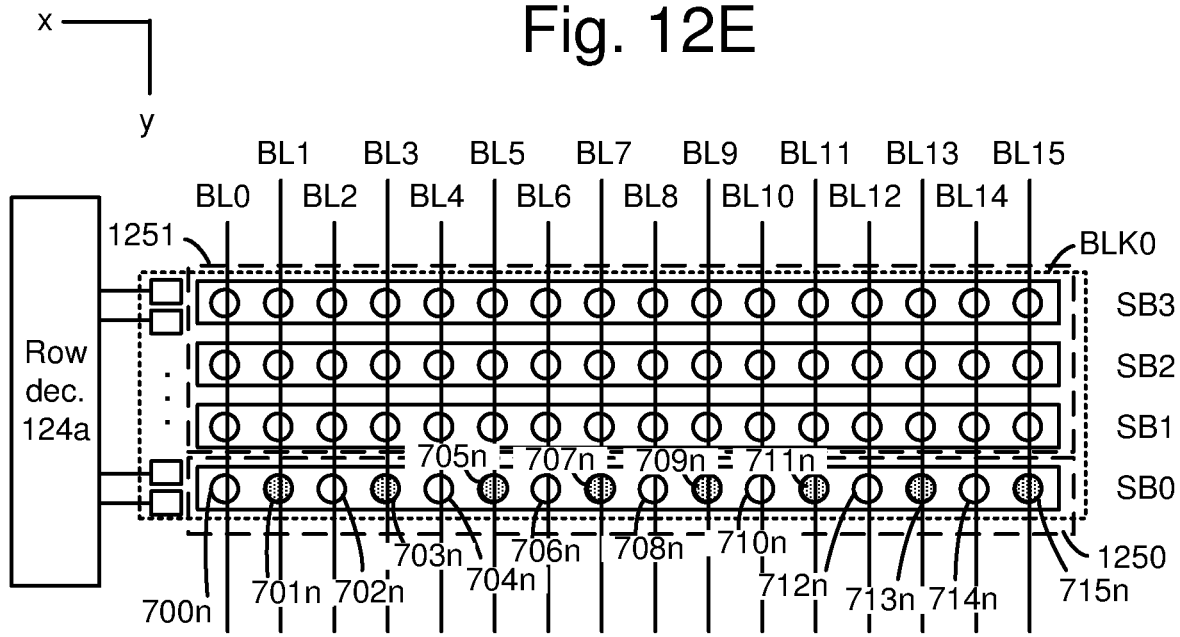
FIG. 12E depicts a top view of the block BLK0, in an example configuration of a memory device for implementing the process of FIG. 11A with high and low access speed sub-blocks.

FIG. 12E depicts a top view of the block BLK0, in an example configuration of a memory device for implementing the process of FIG. 11A with high and low access speed sub-blocks. A region 1250 of BLK0 includes SB0 as a high access speed sub-block, and a region 1251 of BLK0 includes SB1-SB3 as low access speed sub-blocks.

Figure 12F:
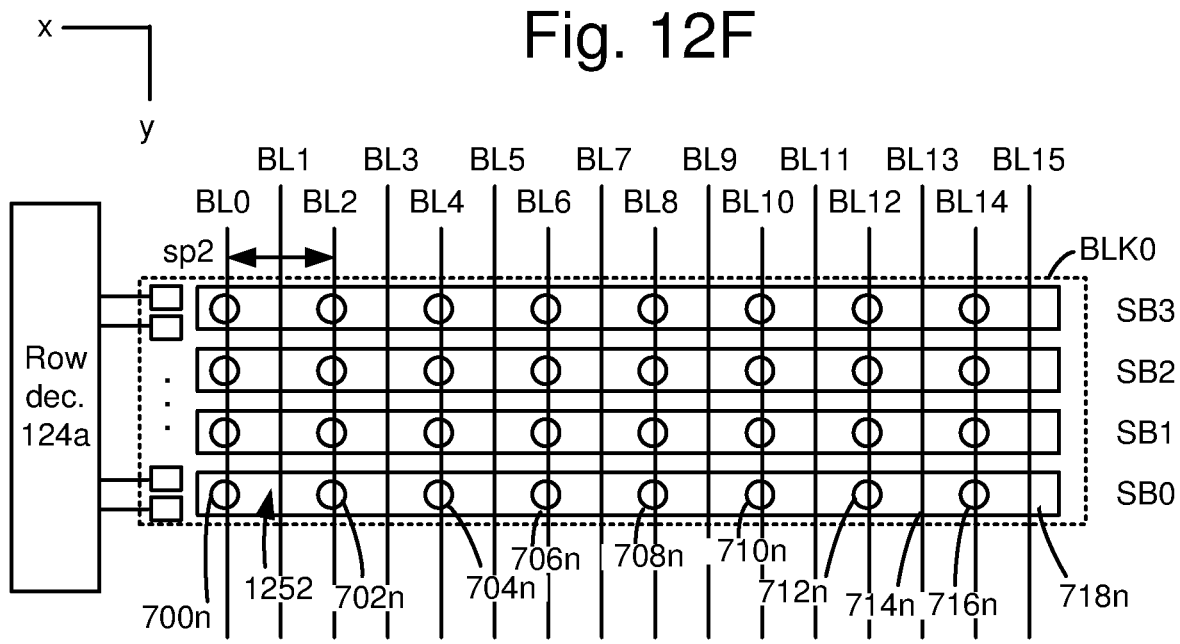
FIG. 12F depicts a top view of the block BLK0, in an example configuration of a memory device for implementing the process of FIG. 11A with data-storing NAND strings separated by insulative regions instead of dummy NAND strings.

FIG. 12F depicts a top view of the block BLK0, in an example configuration of a memory device for implementing the process of FIG. 11A with data-storing NAND strings 700n, 702n, 704n, 706n, 708n, 710n, 712n, 714n, 716n and 718n separated by insulative regions instead of dummy NAND strings. As mentioned, the fabrication process of the memory device can be modified by provide insulative regions (such as example insulative region 1252) in place of dummy NAND strings. A mask which is used to etch the memory holes can be modified for BLK0 to provide a wider spacing sp2 between NAND strings in each sub-block of BLK0, as an example. Another option is to provide the insulative regions in place of dummy NAND strings in one sub-block, and provide the dummy NAND strings in another sub-block.

Figure 13:
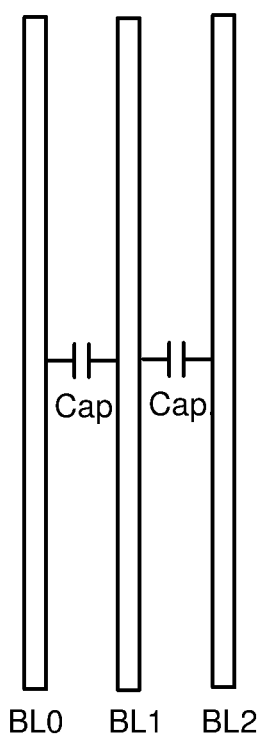
FIG. 13 depicts example bit lines BL0-BL2, consistent with FIGS. 8, 12A, 12E and 12F, showing how a capacitance exists between adjacent bit lines.

FIG. 13 depicts example bit lines BL0-BL2, consistent with FIGS. 8, 12A, 12E and 12F, showing how a capacitance (Cap.) exists between adjacent bit lines. The magnitude of the capacitance depends on factors such as the spacing between the bit lines, the materials and the lengths and widths of the bit lines, and the voltage signals on the bit lines. In this example, a desired change in the voltage of one bit line, such as BL1, can be slowed by the capacitance of BL1 relative to its two adjacent bit lines, BL0 and BL2. Generally, the presence of different voltages on adjacent bit lines can induce a displacement current between the bit lines which results in a longer time needed for the voltages on the bit lines to settle at a desired level. This is especially true as the size of the die becomes larger due to the increase in the length of the bit lines.

In some case, the three adjacent bit lines may receive a same voltage signal, such as when Vbl increase from 0 V to 2 V to inhibit programming of a NAND string during a program pulse. The inter-bit line capacitance is relatively low in this situation. In another example, Vbl increases from 0 V to 2 V on BL1 but remains at 0 V for BL0 and BL2, such as when BL0 and BL2 are connected to selected NAND strings, which are not inhibited during a program pulse. The inter-bit line capacitance is relatively high in this situation. Another example is when one adjacent bit line receives a same voltage signal as BL1 but the other adjacent bit line receives a different voltage signal than BL1. The inter-bit line capacitance is moderate in this situation.

Generally, when a set of adjacent NAND strings are programmed, the time allocated for the bit line voltage to change has to be set based on the worst case scenario, e.g., the worst case inter-bit line capacitance. The techniques provided herein can reduce the worst case inter-bit line capacitance by floating every other bit line during programming. A floating bit line presents minimal capacitance to an active bit line on which the voltage changes. This approach ensures that the voltages float on both adjacent bit lines of an active bit line. Further, during sensing, by electrically disconnecting every other bit line (dummy bit lines) from a memory cell channel of a respective NAND string, this avoids a data state dependent bit line charge up time and current draw from the bit line to the channel, for these dummy bit lines. This also reduced inter-bit line capacitance.

Figure 14:
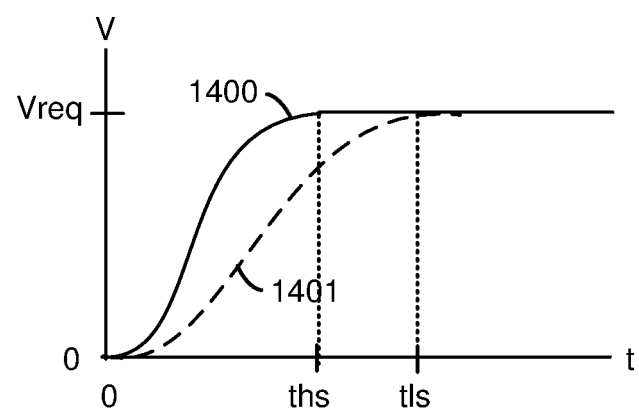
FIG. 14 depicts a plot of a voltage versus time, showing a relatively fast increase and a relatively slow increase.

FIG. 14 depicts a plot of a voltage versus time, showing a relatively fast increase and a relatively slow increase. At t0, a controller commands a voltage driver to change its output from 0 V to Vreq, a requested voltage. When the voltage driver is connected to a bit line, the time to change the voltage is affected by the RC time constant of the bit line. In one example (plot 1400), the increase occurs relatively quickly, in a time period the (hs=high speed). In another example (plot 1401), the increase occurs relatively slowly, in a time period tls (ls=low speed). The time periods ths and tls could represent the time period t2-t3 or t9-t10 in FIG. 15, in which Vbl increases from 0 V to 2 V, for example. During a program operation, the voltage timing circuit 117 (FIG. 1) can allocate a time for changing a bit line voltage based on knowing whether the voltages are floating on the adjacent bit lines. If the voltages are floating on the adjacent bit lines, a shorter access time (e.g., ths) can be allocated. If the voltages are not floating, a longer access time (e.g., tls) can be allocated. The allocated time period can be set for various changes in a voltage signal which occur during a program or read operation, for example. See FIGS. 15 and 16, for example. Different allocated time periods can be set for a same change in a voltage signal, for high or low speed accesses of memory cells.

Similarly, during a sensing operation, which may occur as the verify test of a program operation or as a separate read operation, the voltage timing circuit 117 can allocate a shorter time for charging up a bit line voltage when every other bit line is used for sensing rather than when every bit line is used.

A relatively high access speed is obtained by allocating a relatively short time period to change a voltage on a word line, while a relatively low access speed is obtained by allocating a relatively long time period to change a voltage (e.g., by a same amount) on a word line.

Figure 15:
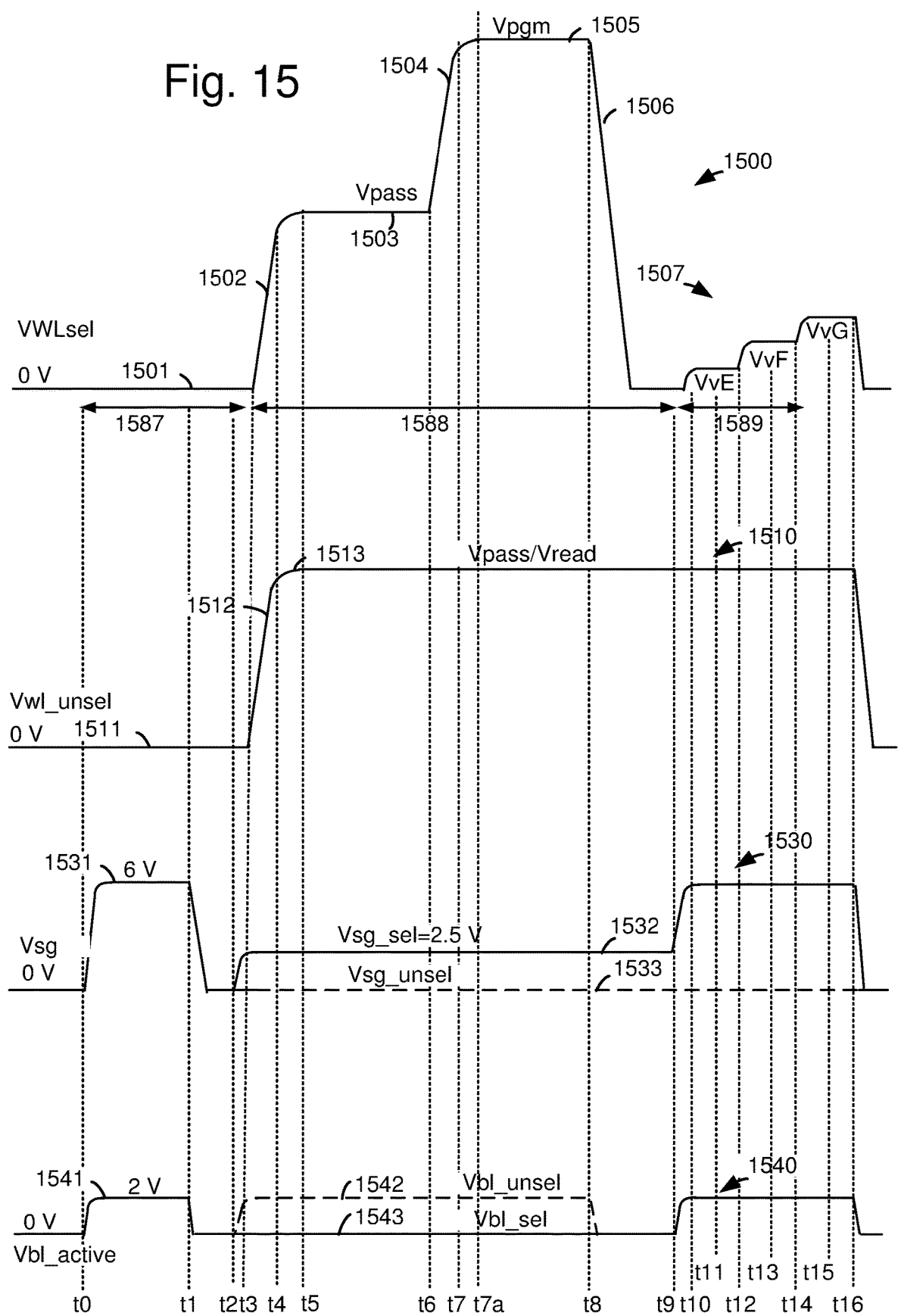
FIG. 15 depicts examples of voltage signals which can be used in a program loop of a program operation, consistent with FIG. 11B.

FIG. 15 depicts examples of voltage signals which can be used in a program loop of a program operation, consistent with FIG. 11B. In FIGS. 15 and 16, the vertical dimension denotes voltage and the horizontal dimension denotes time, with time points t0-t16. The period of time depicted corresponds to one program loop and includes a pre-charge phase 1587 (t0-t3), a program phase 1588 (t3-t9) and a verify phase 1589 (t9-t16). Example voltages of the signals are also depicted. A voltage signal 1500 represents VWLn, the voltage of the selected word line, a voltage signal 1510 represents Vwl_unsel, a voltage of remaining unselected word lines, a voltage signal 1530 represent the select gate voltages, e.g., Vsgd and/or Vsgs, and a voltage signal 1540 represents Vbl, a bit line voltage.

The voltage signal 1500 is represented by a plot 1501 at an initial value such as 0 V, a plot 1502 representing a first step increase in WLn, from the initial value to an intermediate value, e.g., Vpass, a plot 1503 in which WLn is held at Vpass, a plot 1504 representing a second step increase, from Vpass to Vpgm, a plot 1505 representing a holding period at Vpgm, a plot 1506 representing a decrease from Vpgm to the initial value, and a plot 1507 representing verify voltages of VvE, VvF and VvG, for example.

During a program operation, example time periods which are allocated for a voltage increase of VWLsel are t3-t4 (increase from an initial voltage to Vpass), t6-t7 (increase from a Vpass to Vpgm), t1-t11 (increase from an initial voltage to VvE), t12-t13 (increase from VvE to VvF), and t14-t15 (increase from VvF to VvG).

The voltage signal 1510 is represented by a plot 1511 at an initial value such as 0 V, a plot 1512 representing an increase in Vwl_unsel from the initial value to a pass value, e.g., Vpass, and a plot 1513 in which Vwl_unsel is held at Vpass from t3-t4.

The voltage signal 1530 is represented by a plot 1531 during the pre-charge for selected and unselected select gate transistors. The selected select gate (SG) transistors are in a selected sub-block (a sub-block selected for programming), and the unselected SG transistors are in unselected sub-blocks (sub-blocks which are not selected for programming). Subsequently, a plot 1532 with Vsg_sel=2.5 V represents the voltage of the selected SG transistors, and a plot 1533 with Vsg_unsel=2.5 V represents the voltage of the unselected SG transistors.

The voltage signal 1540 is represented by a plot 1541, depicting a voltage Vbl_active=2 V, during the pre-charge for the active bit lines, e.g., the selected and unselected bit lines connected to selected and unselected NAND strings, respectively, in a selected sub-block, in one approach. Subsequently, a plot 1542 depicts Vbl_unsel=2 V (a voltage on unselected bit lines), and a plot 1543 depicts Vbl_sel=0 V (a voltage on selected bit lines). The voltage on the dummy bit lines, if applicable, can be floated and will tend to follow the voltages of the adjacent active bit lines. Example time periods which are allocated for changing Vbl include t2-t3 and t9410, where Vbl may increase from 0 V to Vbl_unsel. This time period can be a relatively short first time period when voltages are floated on every other bit line, or a relatively long second time period when voltages are driven on every bit line. Another time period which can be set shorter or longer for high or low access speed, respectively, is the time period from the start of the increase in Vbl (at t2) to the start of the increase of VWLsel or Vwl_unsel at t3. Another time period which can be set shorter or longer for high or low access speed, respectively, is the time period from the start of the increase in Vbl (at t9) to the start of a sensing operation at t11, for instance, when bit line charging occurs.

In the pre-charge phase, a positive Vbl_active (plot 1541) is provided to the drain-side of the channels of the strings to remove residue electrons and to provide a small amount of boosting such as 1-2 V. The SGD transistors of the selected and unselected sub-blocks are in a conductive state at this time, with a voltage of 6 V, for example. This allows the bit line voltage to be passed to the drain end channel. It is also possible for the SGS transistors of the selected and unselected sub-blocks to be in a conductive state at this time, with a voltage of 6 V, for example (plot 1531) to allow the source line voltage (Vsl) to be passed to the source end of the channel.

In the program phase, VWLn and Vwl_unsel are ramped up, e.g., starting at t2, to provide a capacitive coupling up of the channels of the unselected NAND strings. VWLn is then ramped up further at t6-t7 to the peak program pulse level of Vpgm and held at Vpgm until t8. After the program pulse, VWLn is ramped down to Vss (0 V) at t8. Subsequently, in the verify phase, one or more verify tests are performed by applying one or more control gate read voltages (plot 1507) on WLn and, for each read voltage, sensing the conductive state of the memory cells in the selected NAND strings of the selected sub-block.

During the program and verify phases, Vsg_sel can be set to, e.g., 2.5 V and 0 V, respectively, for the selected sub-block (plot 1532) and the unselected sub-blocks (plot 1533). During the program pulse, with Vbl=0 V (plot 1543), Vsg_sel is high enough to provide the SG_sel transistors in a conductive state for the selected NAND strings. However, it is low enough that the SG_sel transistors can be provided in a non-conductive state for the unselected NAND strings, by setting a high Vbl for those strings. During the program and verify phases, Vbl_unsel can remain high at 2 V for the unselected NAND strings (plot 1542). Vbl_sel can be increased during the verify phase as part of a sensing process in which the bit lines are charged up.

During the verify phase, the SGD transistor is in a strongly conductive state to allow sensing to occur for the selected memory cell. Thus, the drain-end select gate transistor is in a conductive state during the pre-charge phase and the program phase, for the selected NAND strings. Vsg_unsel is decreased to a reduced level such as 0 V which provides the SG_unsel transistors in a non-conductive state for the strings in the unselected sub-blocks. After the verify phase, at t16, Vbl is decreased to 0 V so that the SGD transistors are cutoff and the channel region has a floating voltage.

The time lines and points in FIGS. 14 and 15 represent both the high and low accesses speed cases. In FIGS. 14 and 15, after t3 and t2, respectively, the values of the time points will be lower for the high access speed case than the low access speed case.

FIG. 16 depicts examples of voltage signals which can be used in a read operation, consistent with FIG. 11E. A plot 1650 represents VWLsel. In this example, the read operation include two read voltages, VrA and VrE, which are used to read a lower page of data, in a configuration using MLC memory cells with eight data states. The voltage increases from an initial voltage such as 0 V to VrA at t2, and from VrA to VrE at t6.

A plot 1660 represents Vwl_unsel, the voltage on the unselected word lines. Vwl_unsel increases from an initial voltage to Vpass at t2, is held at Vpass until t10, and then decreases back to the initial voltage.

A plot 1670 represents Vsg, the voltage on the SGD and SGS transistors. Referring to plot 1671 which is used for the selected sub-block, Vsg increases from an initial voltage to a turn on level such as 6 V at t2, is held at that level until t10, and then decreases back to the initial voltage. Vsg is high enough to provide the SGD and SGS transistors in a strongly conductive state to allow sensing to occur. For the unselected sub-blocks, plot 1672 shows that Vsg may be set to 0 V to keep the SGD and SGS transistors in a non-conductive state so that they do not interfere with sensing of the selected sub-block.

A plot 1680 represents Vbl, the bit line voltage. Vbl increases from an initial voltage to a positive voltage such as 2 V at t2, is held at that level until t10, and then decreases back to the initial voltage. A common voltage signals can be applied on the dummy and active bit lines, in one approach. Example time periods which are allocated for changing Vbl include t2-t3, where Vbl may increase from 0 V to 2 V as it is charged up to prepare for sensing, for example, or other suitable level for sensing. This time period can be a relatively short first time period when a relatively high access speed portion of the memory device is read, or a relatively long second time period when a relatively low access speed portion of the memory device is read. Another example of a time period which can be set shorter or longer for high or low access speed, respectively, is the time period from the start of the increase in Vbl (at t2) to the start of a sensing operation at t4, for instance.

The plot 1680a shows an option in which Vbl increases with a voltage kick, as mentioned in connection with FIG. 11E. A voltage signal with a kick refers to, e.g., a voltage signal which is increased from a starting voltage to a peak voltage temporarily and then decreased slightly to a final voltage. A requested output of a voltage driver is set to the peak voltage and then to the final voltage to cause the voltage to increase from the starting voltage to the final voltage more quickly than if the requested output of the voltage driver changed directly from the starting voltage to the final voltage. The peak voltage could be, e.g., up to 10-30% higher than the final voltage. The voltage signal has an overshoot above the desired final voltage. In one approach, Vbl can be increased to a peak of 2.2 V and then decreased to a final voltage of 2 V, representing a 20% overshoot. The plot 1680b shows an option in which Vbl increases without a voltage kick.

Generally, during sensing of a first set of NAND strings, the bit line drivers can be configured to drive a first set of bit lines without a voltage kick while driving a second set of bit lines with a voltage kick, where the first set of bit lines are connected to data-storing NAND strings and the second set of bit lines are connected to dummy NAND strings. It is also possible to also drive the first set of bit lines with a voltage kick.

A plot 1680 represents Vsense, a voltage in a sense node of a sense circuit. Vsense increases from an initial voltage to a positive voltage such as 2 V at t2. At t4, the sense node is allowed to communicate with the bit line when VrA is applied. An amount of decay in the sense node is determined to evaluate whether a memory cell is in a conductive or non-conductive state. If the memory cell has VrA>Vth and is therefore in a conductive state, plot 1693 shows that the sense node voltage will decay below a trip voltage, Vtrip at a sense time t5. If the memory cell has VrA≤Vth and is therefore in a non-conductive state, plot 1691 shows that the sense node voltage will not decay significantly at the sense time t5.

Similarly, at t8, the sense node is allowed to communicate with the bit line when VrE is applied. If the memory cell has VrE>Vth and is therefore in a conductive state, plot 1694 shows that the sense node voltage will decay below a trip voltage, Vtrip at a sense time t9. If the memory cell has VrE≤Vth and is therefore in anon-conductive state, plot 1692 shows that the sense node voltage will not decay significantly at the sense time t5.

Sensing of a SLC memory cell can proceed similarly except that VWLsel is set to a single read voltage of Vr (FIG. 9A).

In one implementation, an apparatus comprises: a first set of NAND strings (700n, 702n, 704n, 706n, 708n, 710n, 712n and 714n); a second set of NAND strings (790-790p); a first set of bit lines (BL0, BL2, BL4, BL6, BL8, BL10, BL12 and BL12) interleaved with a second set of bit lines (BL1, BL3, BL5, BL7, BL9, BL11, BL13 and BL15); and bit line drivers (440, 440a, 440b) configured to drive the first set of bit lines and the second set of bit lines during programming of the second set of NAND strings, and to drive the first set of bit lines and float the second set of bit lines during programming of the first set of NAND strings.

In another implementation, a method comprises: during programming of a first sub-block (SB0) comprising an unselected NAND string (700n) connected to a first bit line (BL0): increasing a voltage on the first bit line to an inhibit voltage while floating a voltage on a bit line (BL1) adjacent to the first bit line, and after a first time period (ths) has passed since starting the increasing of the voltage on the first bit line to the inhibit voltage, increasing a voltage on a selected word line (VWLsel) to a program voltage (e.g., starting at t3 in FIG. 15); and during programming of a second sub-block (SB1) comprising an unselected NAND string (710z) connected to the first bit line: increasing a voltage on the first bit line to the inhibit voltage while driving a voltage on the bit line adjacent to the first bit line, and after a second time period (tls), greater than the first time period, has passed since starting the increasing of the voltage on the first bit line to the inhibit voltage, increasing a voltage on a selected word line to a program voltage (e.g., starting at t3 in FIG. 15).

In another implementation, an apparatus comprises: NAND strings (700n, 702n, 704n, 706n, 708n, 710n, 712n and 714n) in a first block (BLK0); NAND strings (790-790p) in a second block (BLK1); a first set of bit lines (BL0, BL2, BL4, BL6, BL8, BL10, BL12 and BL12) interleaved with a second set of bit lines (BL1, BL3, BL5, BL7, BL9, BL11, BL13 and BL15), the first set of bit lines is connected to the NAND strings in the first block and to the NAND strings in the second block, and the second set of bit lines is disconnected from the NAND strings in the first block and connected to the NAND strings in the second block; means (440, 440a) for driving the first set of bit lines and floating the second set of bit lines during programming of the NAND strings in the first block; and means (440, 440a) for driving the first set of bit lines and the second set of bit lines during programming of the NAND strings in the second block.

The means for driving the first set of bit lines and floating the second set of bit lines, and the means for driving the first set of bit lines and the second set of bit lines, may include the controller 122, control circuitry 110, the power control module 116 including the voltage timing circuit 117, read/write circuits 128 including the column decoder 132 and the bit line voltage drivers 440 and 440a, and the BL selector 173, of FIG. 1-3, or other logic hardware, and/or other executable code stored on a computer readable storage medium or device. Other embodiments may include similar or equivalent means.

In another implementation, an apparatus comprises: a set of NAND strings extending vertically in a stack, the set of NAND strings comprises a NAND string (700n) eligible to store data and a NAND string (710z) ineligible to store data, the NAND string eligible to store data comprises memory cells (704-713) arranged along a channel (700a), and the NAND string ineligible to store data comprises memory cells (724-733) arranged along a channel (710a); and a bit line (BL0) extending horizontally and directly above the NAND string eligible to store data and the NAND string ineligible to store data, the bit line is electrically connected to the channel of the NAND string eligible to store data and electrically disconnected from the channel of the NAND string ineligible to store data.

In another implementation, a system comprises: a controller (110, 122); and a memory die (108) connected to the controller. The memory die comprises: a first group comprising sets of connected memory cells (700n, 702n, 704n, 706n, 708n, 710n, 712n and 714n); a second group comprising sets of connected memory cells (790-790p); a first set of bit lines (BL0, BL2, BL4, BL6, BL8, BL10, BL12 and BL12) interleaved with a second set of bit lines (BL1, BL3, BL5, BL7, BL9, BL11, BL13 and BL15); and a bit line driver (440, 440a) configured to, in response to a program command involving the second group, drive a bit line in the second set of bit lines, and in response to a program command involving the first group, float the bit line in the second set of bit lines and drive a bit line in the first set of bit lines.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a first block of memory cells, the first block comprising a first stack of alternating conductive and dielectric layers formed on a substrate, the conductive layers are connected to the memory cells, the memory cells are arranged in a first set of NAND strings extending vertically upward from the substrate to a top of the first stack, and the first set of NAND strings comprises rows of data-storing NAND strings interleaved with rows of dummy NAND strings;
an insulation layer at the top of the first stack;
a first set of bit lines interleaved with a second set of bit lines above the insulation layer; and
a respective conductive via in the insulation layer for each NAND string of the rows of data-storing NAND strings, a bottom of each respective conductive via contacts a top of each respective NAND string of the rows of data-storing NAND strings, a top of each respective conductive via contacts a respective bit line of the first set of bit lines to electrically connect the first set of bit lines to the data-storing NAND strings, and a bottom of the insulation layer contacts a top of each respective dummy NAND string to electrically disconnect the second set of bit lines from the dummy NAND strings.

2. The apparatus of claim 1, wherein:
each respective conductive via extends vertically upward in the insulation layer from the top of each respective NAND string of the rows of data-storing NAND strings to a bottom of the respective bit line of the first set of bit lines.

3. The apparatus of claim 1, wherein:
a respective conductive via is not provided in the insulation layer for each NAND string of the rows of dummy NAND strings.

4. The apparatus of claim 1, wherein:
each bit line of the first set of bit lines extends horizontally directly over a respective row of the data-storing NAND strings in the first block; and
each bit line of the second set of bit lines extends horizontally directly over a respective row of the dummy NAND strings in the first block.

5. The apparatus of claim 1, wherein:
each of the data-storing NAND strings and the dummy NAND strings comprises a respective vertical pillar extending from the substrate to the top of the first stack.

6. The apparatus of claim 1, further comprising:
a bit line driver connected to the first set of bit lines and the second set of bit lines, the bit line driver is configured to drive the first set of bit lines while floating voltages of the second set of bit lines during programming of the data-storing NAND strings.

7. The apparatus of claim 1, further comprising:
a second block of memory cells, the second block comprising a second stack of alternating conductive and dielectric layers formed on the substrate, the conductive layers of the second block are connected to the memory cells of the second block, the memory cells of the second block are arranged in a second set of NAND strings extending vertically upward from the substrate to a top of the second stack, and the second set of NAND strings comprises a first set of rows of data-storing NAND strings interleaved with a second set of rows of data-storing NAND strings, wherein:
each respective data-storing NAND string in the first set of rows of data-storing NAND strings is electrically connected to a respective bit line of the first set of bit lines; and
each respective data-storing NAND string in the second set of rows of data-storing NAND strings is electrically connected to a respective bit line of the second set of bit lines.

8. The apparatus of claim 7, further comprising:
a bit line driver connected to the first set of bit lines and the second set of bit lines, the bit line driver is configured to drive the first set of bit lines while floating voltages of the second set of bit lines during programming of the data-storing NAND strings in the first block, and to drive the first set of bit lines and the second set of bit lines during programming of the first set of rows of data-storing NAND strings and the second set of rows of data-storing NAND strings of the second block.

9. The apparatus of claim 7, further comprising:
a bit line driver connected to the first set of bit lines and the second set of bit lines, the bit line driver is configured to allocate a first time period when changing a voltage of the first set of bit lines during programming of the data-storing NAND strings in the first block, and to allocate a second time period, greater than the first time period, when changing a voltage of the first set of bit lines and the second set of bit lines during programming of the first set of rows of data-storing NAND strings and the second set of rows of data-storing NAND strings of the second block.

10. The apparatus of claim 7, further comprising:
an insulation layer at the top of the second stack; and
conductive vias extending through the insulation layer at the top of the second stack, the conductive vias electrically connect each respective data-storing NAND string in the first set of rows of data-storing NAND strings to the respective bit line of the first set of bit lines and each respective data-storing NAND string in the second set of rows of data-storing NAND strings to the respective bit line of the second set of bit lines.

11. The apparatus of claim 7, further comprising:
a bit line driver connected to the first set of bit lines and the second set of bit lines, wherein a distance between the bit line driver and the second block is greater than a distance between the bit line driver and the first block.

\* \* \* \* \*